United States Patent [19]
Kimura

[11] Patent Number: 5,515,003
[45] Date of Patent: May 7, 1996

[54] OPERATIONAL AMPLIFIER

[75] Inventor: Hiroshi Kimura, Hyogo, Japan

[73] Assignee: Matsushita Electric Industrial Co., LTD., Osaka, Japan

[21] Appl. No.: 383,366

[22] Filed: Feb. 3, 1995

[30] Foreign Application Priority Data

Feb. 4, 1994 [JP] Japan ................................. 6-012345
Sep. 22, 1994 [JP] Japan ................................. 6-227503

[51] Int. Cl.$^6$ .................................................... H03F 3/45
[52] U.S. Cl. ......................... 330/253; 330/255; 330/257; 330/261
[58] Field of Search ................................. 330/253, 255, 330/257, 261

[56] References Cited

U.S. PATENT DOCUMENTS 4,734,654  3/1988  Fernandez ............................... 330/257

OTHER PUBLICATIONS

M. G. Degrauwe et al., "Adaptive Biasing CMOS Amplifiers", IEEE Journal of Solid–State Circuits, vol. SC–17, No. 3, Jun. 1982, pp. 522–528.
R. Klinke et al., "A Very–High–Slew–Rate CMOS Operational Amplifier", IEEE Journal of Solid–State Circuits, vol. 24, No. 3, Jun. 1989, pp. 744–746.

Primary Examiner—James B. Mullins
Attorney, Agent, or Firm—Willian Brinks Hofer Gilson & Lione

[57] ABSTRACT

This invention discloses a high-slew-rate CMOS operational amplifier. This operational amplifier has a differential input stage formed by first and second transistors of the NMOS type connected together source-to-source and a first constant-current source. The first constant-current source is formed by an NMOS transistor coupled to the sources of the first and second transistors. The gates of third, fourth, and fifth transistors are respectively fed $V_{in+}$, $V_{in-}$, and the source voltage of the first and second transistors. A second constant-current source, formed by a PMOS transistor, applies a bias current to the sources of the third, fourth, and fifth transistors. In the steady state (i.e., $V_{in+}=V_{in-}$), all the bias current from the second constant-current source flows into the fifth transistor. As a result, the third and fourth transistors are cut off, whereupon the differential input stage is biased by a given bias-current from the first constant-current source. If $V_{in+}$ rises higher than $V_{in-}$, this increases the source voltage of the first and second transistors. As a result, the fifth transistor is cut off, and the bias current of the second constant-current source comes to flow into the fourth transistor. A current proportional to the current flowing in the fourth transistor is added by a current mirror circuit of plural NMOS transistors to the current of the first constant-current source, whereupon the bias current of the differential input stage is increased.

24 Claims, 26 Drawing Sheets

OPERATIONAL AMPLIFIER

BACKGROUND OF THE INVENTION

This invention relates to high-slew-rate operational amplifiers (called op amps) that find suitable applications in sample-and-hold circuits and switched-capacitor filters.

FIG. 18 shows an inverting amplifier using a conventional op amp of the two-stage configuration. FIG. 18 shows a case in which two NMOS transistors act as a differential-input-stage transistor pair (called a differential pair).

As shown in FIG. 18, the first stage is a differential amplifier that is made up of a differential input stage and an active load. The differential input stage is formed by NMOS transistors Q1, Q2 and an NMOS transistor Q8 acting as a constant-current source. These transistors Q1 and Q2 are connected together source-to-source. The active load is formed by PMOS transistors Q4 and Q5. On the other hand, the second stage is an inverter amplifier formed by a common-source PMOS transistor Q7 and an NMOS transistor Q6 acting as an active load. Cc is a compensation capacitor for phase compensation. CL is a load capacitor. R is a resistor. Since the gain of op amps is very high, this usually requires application of negative feedback.

In the above-described conventional op amp, the slew rate is determined by Io (i.e., the bias current of the first-stage differential amplifier) or Is (i.e., the bias current of the constant-current source load of the second-stage inverter amplifier), when inputting large signals. FIG. 18 illustrates this situation. In a steady state in which a virtual short holds, an electric current flowing in each of Q1 and Q2 is Io/2. Under this condition, if the input voltage $V_{in}$ rises rapidly up to $V_1$, the output voltage $V_{out}$ tries to go down to $-V_1$. However, the output voltage $V_{out}$ cannot catch up with such a sudden rise in the input voltage $V_{in}$, as a result of which the potential of the gate of Q2 goes up and Q1 is cut off. Therefore, the current Io comes to flow in Q2. The current Io is mirrored to Q4 by the active load comprising Q4 and Q5. This current Io will try to charge the compensation capacitor Cc at a rate Sr1 given by the following formula (1):

$$Sr1 = dV/dt = Io/Cc \qquad (1)$$

Io: 1st-stage differential amplifier's bias current
Cc: compensation capacitor's capacitance Meanwhile, the output voltage $V_{out}$ tries to go down to $-V_1$ at a rate Sr2 given by the following formula (2):

$$Sr2 = dV/dt = (Is - Io)/CL \qquad (2)$$

Is: 2nd-stage inverter amplifier's bias current
CL: load capacitor's capacitance The output slew rate is determined by Sr1 or Sr2, whichever is lower. Because of this fact, it is necessary to increase both Sr1 and Sr2 by increasing both Io and Is for enhancing the slew rate.

However, for the conventional op amp, it is not that easy, since the increase in the bias current not only dissipates much more power but also results in the degradation of the small-signal properties of the differential amplifier. Therefore, the conventional technique finds hard to increase the slew rate. In the differential amplifier the small-signal voltage gain, Av, is given by the following formula (3). g1 and g2 increase in proportion to the current and gm increases in proportion to the square root of the current. This means that the small-signal voltage gain Av decreases as the current increases.

$$Av = gm/(g1 + g2) \qquad (3)$$

gm: Q1's transconductance
g1: Q1's output conductance
g2: Q4's output conductance M. G. Degrauwe et al try to provide a solution to the above-identified problem in their work entitled "Adaptive Biasing CMOS Amplifiers," IEEE Journal of Solid-State Circuits, Vol. SC-17, No. 3, June 1982, pp. 522–528. This paper considers an op amp shown in FIG. 19 for OTA (Operational Transconductance Amplifier). The operation of the FIG. 19 op amp is described below. Q11 to Q31 are transistors. The differential input stage consists of Q11 and Q12, connected together source-to-source, and Q13 acting as a constant-current source. The transistors Q21, Q23, Q24, and Q25 jointly constitute a difference current amplifier circuit. The transistor Q25 turns off if I20 > I22 where I20 is the current flowing in Q20 and I22 is the current flowing in Q22. On the other hand, if I20 < I22, this turns the transistor Q25 on, thereby allowing a current of M×(I22−I20) to flow, where M is the mirror ratio of a current mirror circuit formed by Q24 and Q25. Likewise, the transistors Q27, Q29, Q30, and Q31 jointly constitute another difference current amplifier circuit. If I28 > I26 where I28 is the current flowing in Q28 and I26 is the current flowing in Q26, then an M×(I28−I26) current flows in Q31. At this point in time, I16 (i.e., the current flowing in Q16) is mirrored to I20 and I28, and I17 (i.e., the current flowing in Q17) has been mirrored to I22 and I26. As a result, in a steady state where I16=I17 holds, a given bias current through Q13 flows. If a difference is produced between the currents I16 and I17, then a current proportional to that difference is added to the bias current in order to improve the slew rate.

However, the above-described op amp presents the problem that the current I16 flows into Q20 and Q28 and the current I17 flows into Q22 and Q26. This considerably dissipates power. Further, much larger circuitry is required.

Another solution is offered by R. Klinke et al. in a paper entitled "A Very-High-Slew-Rate CMOS Operational Amplifier," IEEE Journal of Solid-State Circuits, Vol. 24, No. 3, June 1989, pp. 744–746. This paper considers an op amp shown in FIG. 20. In the aforesaid solution proposed by M. G. Degrauwe et al, a current proportional to a difference between specified two currents is added to a bias current. In this solution offered by R. Klinke et al., biasing is controlled according to the difference in voltage between inputs. In FIG. 20, Q41 to Q56 are transistors. The differential input stage is made up of Q41 and Q42, connected together source-to-source, and Q43 acting as a constant-current source. Here, the sizes of Q52, Q53, and Q54 are designed such that both nodes D an E are held LOW when the gate voltages of Q50 and Q51 are identical. As a result of such an arrangement, in the steady state both Q55 and Q56 are cut off and the differential input stage is biased by a given current through Q43. Now suppose that a great difference in voltage is produced between $V_{in+}$ (i.e., the noninverting input voltage) and $V_{in-}$ (i.e., the inverting input voltage). If $V_{in+} > V_{in-}$, the node E goes HIGH thereby turning Q56 on and a current flowing in Q56 is added to the bias current. On the other hand, if $V_{in-} > V_{in+}$, this causes Q55 to turn on. In comparison with the solution by M. G. Degrauwe et al, the circuit size can be held smaller and the power consumption can be held low by this solution.

However, the op amp proposed by R. Klinke et al., too, suffers from the following problem. The nodes D and E are high-impedance nodes, so that both the transistors Q55 and Q56 undergo a sudden turn-off or turn-on. As a result, the sudden increase or decrease in the bias current occurs. This not only degrades the settling characteristics but also generates unwanted noise.

SUMMARY OF THE INVENTION

Bearing in mind the above-described problems associated with the prior art techniques, the present invention was made. Accordingly it is an object of the present invention to provide an improved op amp capable of providing an improved slew rate, with no substantial increase in power consumption, no degradation of small signals, no degradation of settling characteristics, and no generation of noise.

The present invention provides a first op amp. This first op amp comprises:

- a differential input stage having first and second transistors of the first conductivity type that are connected together source-to-source and a constant-current source that is connected with sources of the first and second transistors;
- third, fourth, and fifth transistors of the second conductivity type that are connected together source-to-source;
- a bias feed means for feeding a bias current to sources of the third, fourth, and fifth transistors; and
- a current mirror circuit that has a plurality of transistors of the first conductivity type;

wherein:
- a noninverting input voltage is applied to a gate of the third transistor, and an inverting input voltage is applied to a gate of the fourth transistor, and a source voltage of the first and second transistors is applied to a gate of the fifth transistor; and
- a current proportional to a current flowing in the third or fourth transistor is added by means of the current mirror circuit to a current of the constant-current source.

In the first op amp, the bias feed means may be formed by a constant-current source or resistor.

The aspect of the first op amp of the present invention is as follows. The noninverting input voltage is applied to the third transistor gate. The inverting input voltage is applied to the fourth transistor gate. The source voltage of the first and second transistors, connected together source-to-source, is applied to the fifth transistor gate. Suppose that the first and second transistors are NMOS transistors, that the third to fifth transistors are PMOS transistors, and that the noninverting input voltage is $V_{in+}$, the inverting input voltage $V_{in-}$, and the source voltage of the first and second transistors $V_s$.

If the noninverting and inverting voltages are identical (i.e., $V_{in+}=V_{in-}$), $V_s$ becomes lower than $V_{in+}$ by the gate-source voltage of the first transistor (in other words, $V_s$ becomes lower than $V_{in-}$ by the gate-source voltage of the second transistor). Therefore, the lowest of $V_{in+}$, and $V_{in-}$ change in common mode. Since the third to fifth $V_{in-}$, and $V_s$ is $V_s$. This state remains unchanged even if $V_{in+}$transistors are PMOS transistors, all the current from the bias feed means associated with the sources of the third to fifth transistors flows into the fifth transistor with a gate at which $V_s$ is applied. Accordingly, the third and fourth transistors are cut off, and the differential input stage is biased by a given bias current through the constant-current source connected with the sources of the first and second transistors.

If $V_{in+}$ rises higher than $V_{in-}$, this makes $V_s$ go up. As a result, the fifth transistor is cut off and the bias current of the bias feed means flows into the fourth transistor with a gate at which $V_{in-}$ has been applied. A current proportional to the current flowing in the fourth transistor is added by the current mirror circuit to the current of the constant-current source connected with the sources of the first and second transistors, thereby increasing the bias current of the differential input stage.

Conversely, if $V_{in-}$ rises higher than $V_{in+}$, then $V_{in+}$ becomes the lowest. As a result, the bias current of the bias feed means flows into the third transistor with a gate at which $V_{in+}$ has been applied. A current proportional to the current flowing in the third transistor is added by the current mirror circuit to the current of the constant-current source connected with the sources of the first and second transistors, thereby increasing the bias current of the differential input stage.

As described above, in accordance with the first op amp, the differential input stage is biased by a given bias current in the steady state in which $V_{in+}$ and $V_{in-}$ are equal. If an electric potential is produced between $V_{in+}$ and $V_{in-}$, this adds a current proportional to such an electric potential to the bias current. In other words, larger electric potential causes larger current to be added to the bias current and smaller electric potential causes smaller current to be added to the bias current. As a result of such arrangement, it becomes possible to enhance the slew rate with no substantial increase in the power consumption and no degradation of the small-signal properties. Further, the circuit size can be made smaller. Furthermore, the bias current does not increase rapidly but increases according to the difference in the input voltage, with no degradation of the settling characteristics and no generation of noise.

The present invention provides a second op amp. This first op amp comprises:

- a differential input stage having first and second transistors of the first conductivity type that are connected together source-to-source and a constant-current source that is connected with sources of the first and second transistors;
- a third transistor of the first conductivity type and a fourth transistor of the second conductivity type, the third and fourth transistors being connected together source-to-source;
- a fifth transistor of the second conductivity type and a sixth transistor of the first conductivity type, the fifth and sixth transistors being connected together source-to-source;
- a current mirror circuit that has a plurality of transistors of the first conductivity type;

wherein:
- an inverting input voltage is applied to gates of the third and fifth transistors, and a noninverting input voltage is applied to gates of the fourth and sixth transistors; and
- a current proportional to a current flowing in the third and fourth transistors or the fifth and sixth transistors is added by means of the current mirror circuit to a current of the constant-current source.

The aspect of the second op amp is as follows. The inverting input voltage is applied to the gates of the third and fifth transistors. The noninverting input voltage is applied to the gates of the fourth and sixth transistors. Here, suppose that the first and second transistors are of the NMOS type, that the third and sixth transistors are of the NMOS type, that the fourth and fifth transistors are of the PMOS type, and that the noninverting input voltage is $V_{in+}$ and the inverting input voltage $V_{in-}$.

If $V_{in+}$ and $V_{in-}$ are identical, then the third and fourth transistors, connected together source-to-source, and the fifth and sixth transistors, connected together source-to-source, are cut off because there is no sufficient gate-to-source voltage, and no current flows. As a result, the differential input stage is biased only by the current of the constant-current source connected with the sources of the first and second transistors.

If $V_{in+}$ goes up in relation to $V_{in-}$ to such an extent that a difference in voltage between $V_{in+}$ and $V_{in-}$ exceeds a total of $V_{tp}+V_{tn}$ where $V_{tp}$ is the threshold voltage of a PMOS transistor and $V_{tn}$ the threshold voltage of an NMOS transistor, this makes the fifth and sixth transistors turn on, whereupon a current proportional to the difference flows in the fifth and sixth transistors. The current flowing in these fifth and sixth transistors is added by the current mirror circuit to the current of the constant-current source connected with the sources of the first and second transistors, thereby increasing the bias current of the differential input stage.

Conversely, if $V_{in-}$ goes up in relation to $V_{in+}$ to such an extent that a difference in voltage between $V_{in+}$ and $V_{in-}$ exceeds a total of $V_{tp}+V_{tn}$, this makes the third and fourth transistors turn on, whereupon a current proportional to the difference flows in the third and fourth transistors. This current is added by the current mirror circuit to the current of the constant-current source connected with the sources of the first and second transistors, thereby increasing the bias current of the differential input stage.

The second op amp can achieve a zero current increase in the steady state where $V_{in+}$ and $V_{in-}$ are identical. Further, in accordance with the second op amp, only when an electric potential in excess of a total of $V_{tp}$ and $V_{tn}$ is produced between $V_{in+}$ and $V_{in-}$, a current proportional to such a potential is added to the bias current. Because of such arrangement, it is possible to substantially improve the slew rate with no increase in the power consumption in the steady state.

Additionally, if a level shift circuit, capable of level-shifting the gate input voltage of the third and sixth transistors or the gate input voltage of the fourth and fifth transistors, is added to the second op amp, this provides the improvement that the voltage at which additional bias current starts flowing can be set at a desired value.

DETAILED DESCRIPTION OF THE INVENTION

Preferred embodiments of the present invention will now be described below.

EMBODIMENT 1

Figure 1:
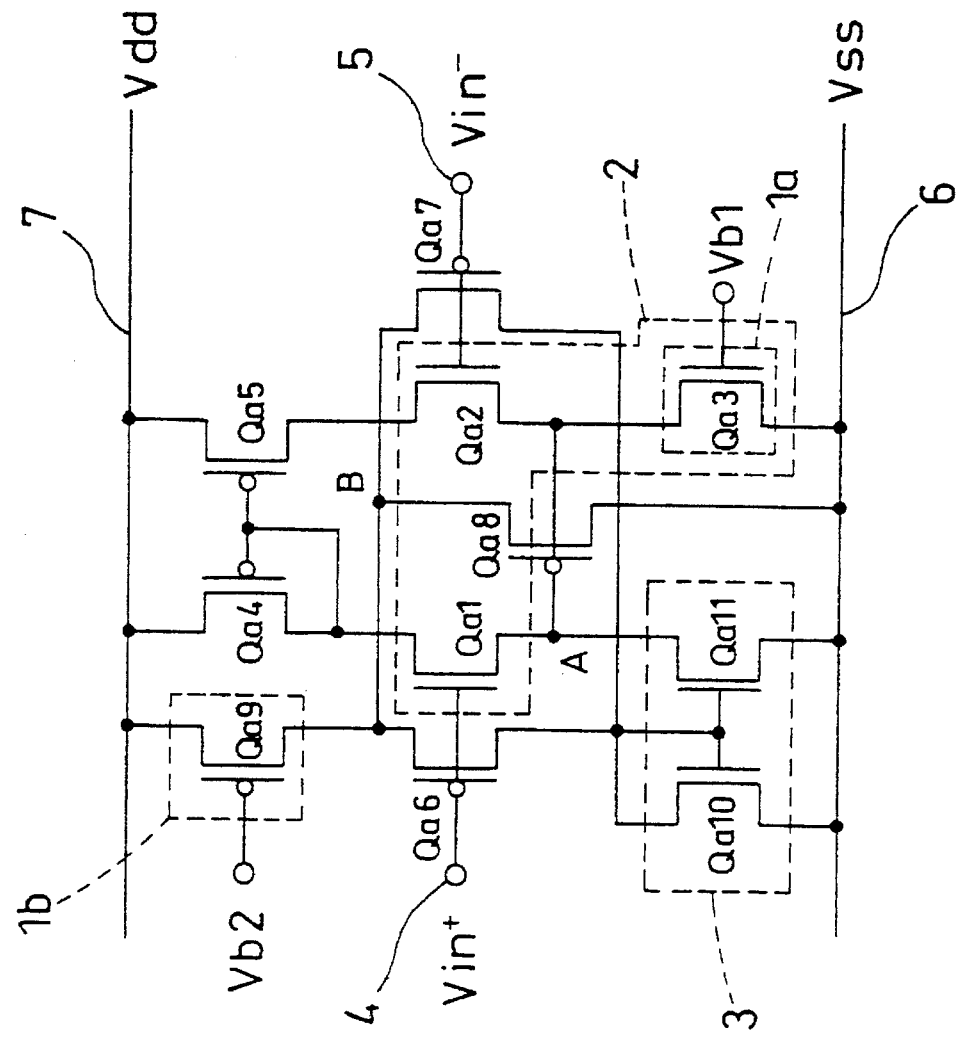
FIG. 1 is a wiring diagram showing a first op amp of the present invention.

A first embodiment of the present invention is described by making reference to FIG. 1. In this embodiment, a differential input stage 2 has a differential pair of NMOS transistors Qa1 and Qa2.

As shown in FIG. 1, the first and second transistors Qa1 and Qa2 are connected together source-to-source. These transistors Qa1 and Qa2 are brought into connection with a first constant-current source 1a formed by an NMOS transistor Qa3 with a gate at which a bias voltage $V_{b1}$ is applied. These three transistors Qa1, Qa2, and Qa3 make up the differential input stage 2. PMOS transistors Qa4 and Qa5 make up an active load for the differential input stage 2. A third, a fourth, and a fifth PMOS transistor, i.e., Qa6, Qa7, and Qa8, are connected together source-to-source. These three transistors Qa6, Qa7, and Qa8 are brought into connection with a second constant-current source 1b formed by a PMOS transistor Qa9 with a gate at which a bias voltage $V_{b2}$ is applied. Additionally a current mirror circuit 3 is made up of NMOS transistors Qa10 and Qa11. Whereas the gate of Qa6 is connected with a noninverting input terminal 4, the gate of Qa7 is connected with an inverting input terminal 5. The gate of Qa8 is connected with the sources of Qa1 and Qa2. The drains of Qa6 and Qa7 are connected with the drain of Qa10 that is a diodeconnected transistor. The drain of Qa8 is connected with a low-level power supply source 6. The drain of Qa11 is connected with the sources of Qa1 and Qa2. Here, a junction between the sources of Qa1 and Qa2 is a node A, and a junction among the sources of Qa6, Qa7, and Qa8 is a node B. 7 is a high-level power supply source. $V_{in+}$ is the noninverting input voltage. $V_{in-}$ is the inverting input voltage. $V_{dd}$ is the high-level supply voltage. $V_{ss}$ is the low-level supply voltage. It is sufficient that there exists a relative difference in magnitude between $V_{dd}$ and $V_{ss}$. Note that the low-level supply voltage ($V_{ss}$) is not limited to the ground voltage. This applies to other embodiments of the present invention which will be discussed later.

If a virtual short holds thereby equalizing $V_{in+}$ and $V_{in-}$, then the voltage of the node A becomes lower than $V_{in+}$ by the gate-to-source voltage of Qa1. In other words, the voltage of the node A becomes lower than $V_{in-}$ by the gate-to-source voltage of Qa2. As a result, all the bias current through Qa9 comes to flow into Qa8. Accordingly the transistors Qa6 and Qa7 turn off, and no current flows in Qa10. The transistor Qa11 turns off, and the differential input stage 2 is biased by a given current from Qa3. Even when the noninverting input voltage $V_{in+}$ and the inverting input voltage $V_{in-}$ change in common mode, such a state is always maintained.

If $V_{in+}$ goes up in relation to $V_{in-}$, then the voltage of the node A increases with $V_{in+}$. Qa8 is cut off and a bias current through Qa9 comes to flow into Qa7. A current flowing in Qa7 flows into Qa10. A current proportional to the current flowing in Qa10 is mirrored and added to the bias current of the differential input stage 2.

Conversely, if $V_{in-}$ goes up in relation to $V_{in+}$, then Qa8 is cut off and a bias current through Qa9 comes to flow into Qa6. A current flowing in Qa6 flows into Qa10. A current proportional to the current flowing in Qa10 is mirrored and added to the bias current of the differential input stage 2.

In accordance with the present embodiment, the differential input stage 2 is biased by a given current when $V_{in+}$ and $V_{in-}$ are identical. Additionally, only when an electric potential is produced between $V_{in+}$ and $V_{in-}$, a current proportional to the electric potential is added to the bias current. That is, larger electric potential causes larger current to be added to the bias current and smaller electric potential causes smaller current to be added to the bias current. As a result of such arrangement, it is possible to substantially improve the slew rate with no substantial increase in the power-consumption and no degradation of the small-signal characteristics. Further, the present embodiment can provide a smaller op amp in comparison with the one proposed by the aforesaid second solution. Furthermore, unlike the second solution in which the bias current increases all at one, in the present embodiment it increases according to the difference in the input voltage. Accordingly, no degradation of the settling characteristics occurs and the generation of noise can be prevented.

In the present embodiment, the transistors Qa1 and Qa2, as the differential pair of the differential input stage 2, are NMOS transistors. However, this is not to be considered restrictive. PMOS transistors may be used instead of employing NMOS transistors as a differential pair, with the same effects. When using PMOS transistors as a differential pair, every transistor of FIG. 1 should be reversed in polarity, and the low-level power supply source should be converted into a high-level one while the high-level power supply source into a low-level one.

Figure 10:
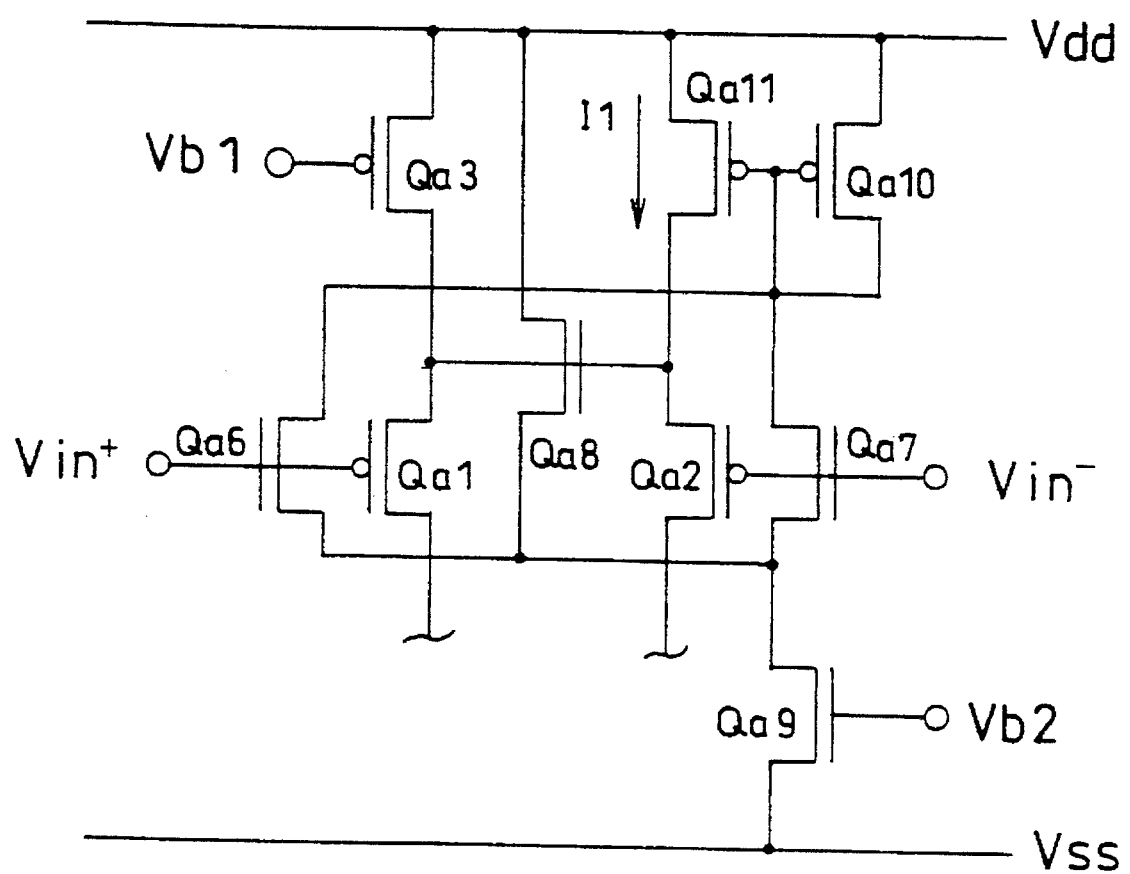
FIG. 10 shows an example of the first op amp using two PMOS transistors as a differential-input-stage transistor pair.

FIG. 10 shows an op amp using two PMOS transistors as the differential pair of Qa1 and Qa2 of the differential input stage 2. In FIG. 10 op amp, corresponding transistors are assigned the same reference numerals and their description is omitted. An active load for a differential input stage is not shown in the figure.

Figure 11:
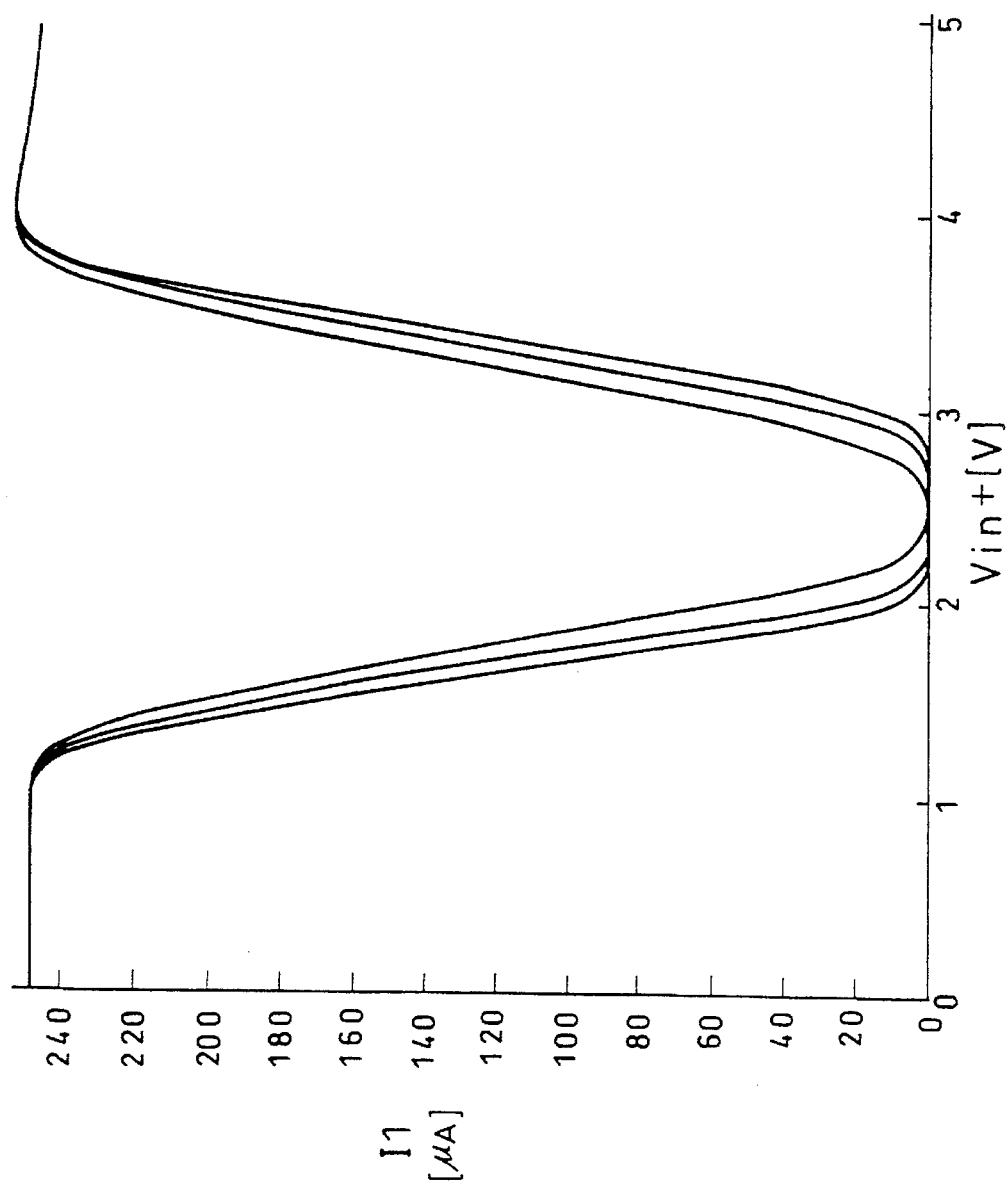
FIG. 11 is a graph showing the relationship of the current to be added to the bias current of the differential input stage versus the noninverting input voltage in the FIG. 10 op amp, when the value of the inverting input voltage is fixed.

In the FIG. 10 op amp, if $V_{in-}$ is fixed at 2.5 V and $V_{in+}$ changes from 0 V to 5 V, then a current I1 to be added to the bias current of the differential input stage makes a change forming a smooth curve according to the electric potential between $V_{in+}$ and $V_{in-}$ (see FIG. 11). Because of this, steady waveforms can be obtained. Further, as shown in FIG. 11, by changing the size of Qa8, it becomes possible to easily set the voltage at which the current I1 starts flowing at any value. Furthermore, by setting the size of the other transistors at a given value, it becomes feasible to easily set the maximum output current and the current increase rate at any value.

Figure 24:
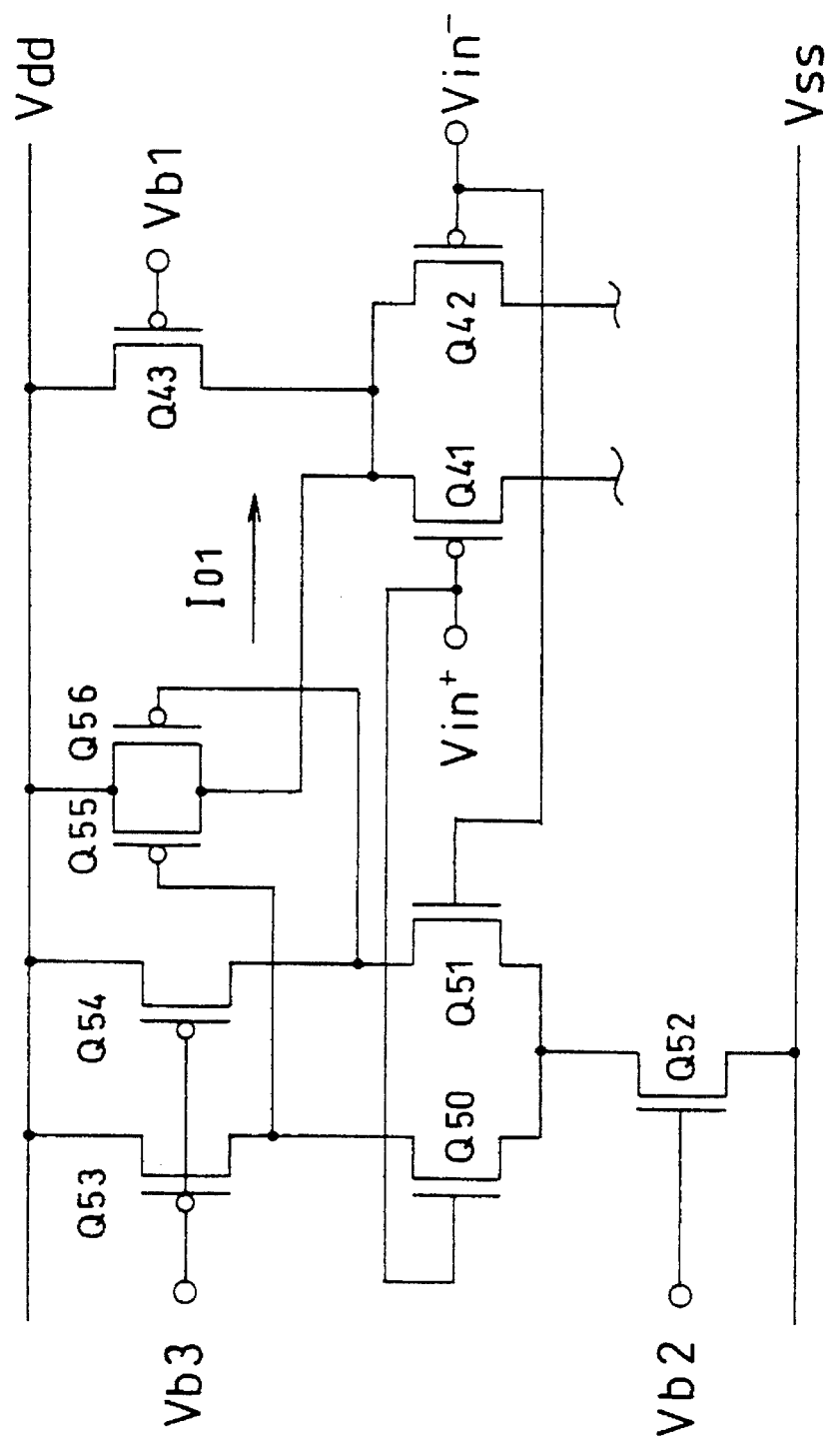
FIG. 24 shows an example of the op amp according to the aforesaid second solution using two PMOS transistors as a differential-input-stage transistor pair.
Figure 25:
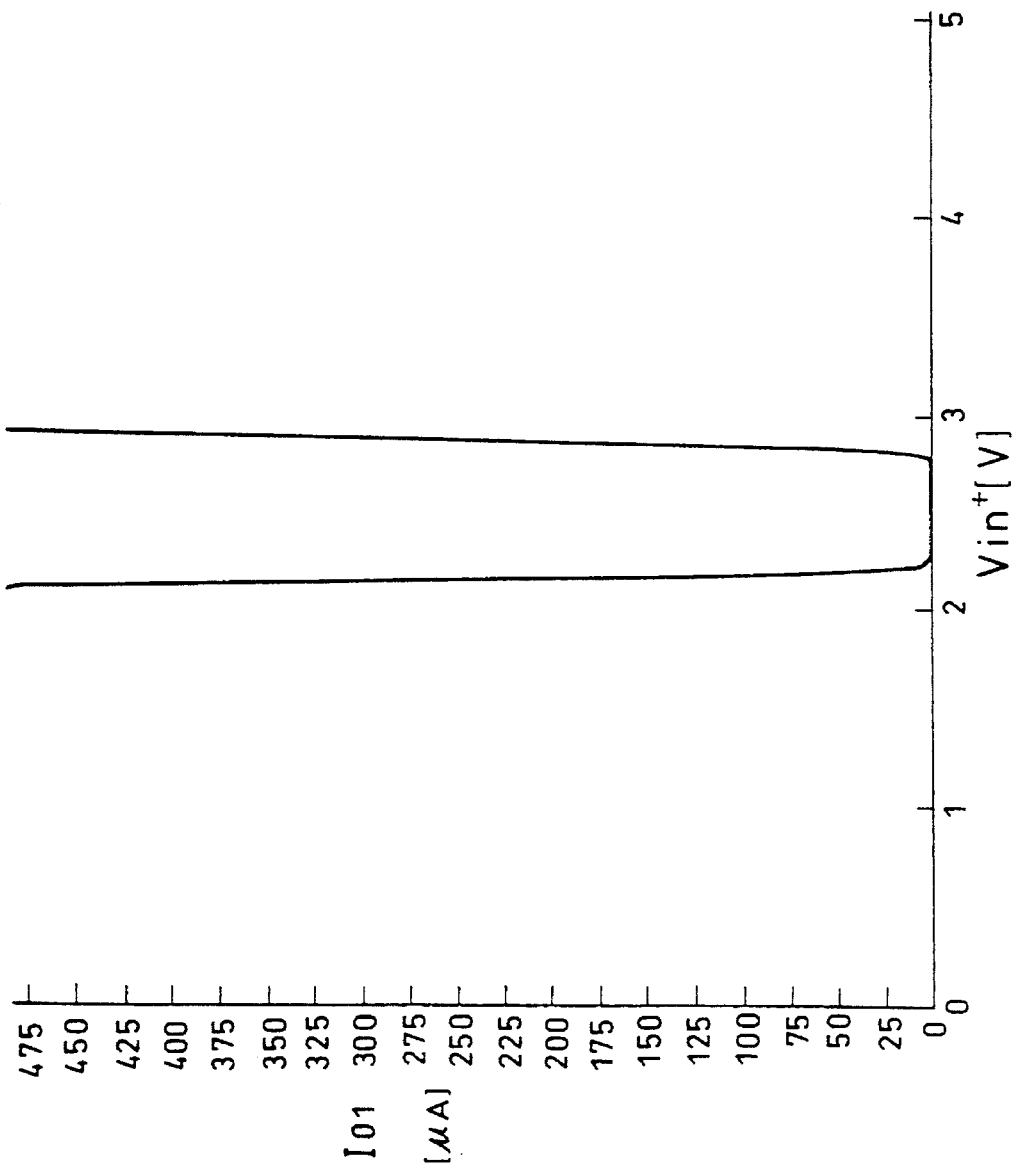
FIG. 25 is a graph showing the relationship of the current to be added to the bias current of the differential input stage versus the noninverting input voltage in the FIG. 24 op amp, when the value of the inverting input voltage is fixed.

The present op amp is compared with the FIG. 24 op amp that uses PMOS transistors as the differential pair of Q41 and Q42 of the differential input stage. Likewise, if $V_{in-}$ is fixed at 2.5 V and $V_{in+}$ changes from 0 V to 5 V, a current I01 to be added to the bias current of the differential input stage undergoes a digital, sudden increase when the electric potential between $V_{in+}$ and $V_{in-}$ exceeds a given threshold as is shown in FIG. 25. This results in the degradation of settling characteristics and the generation of noise.

EMBODIMENT 2

Figure 2:
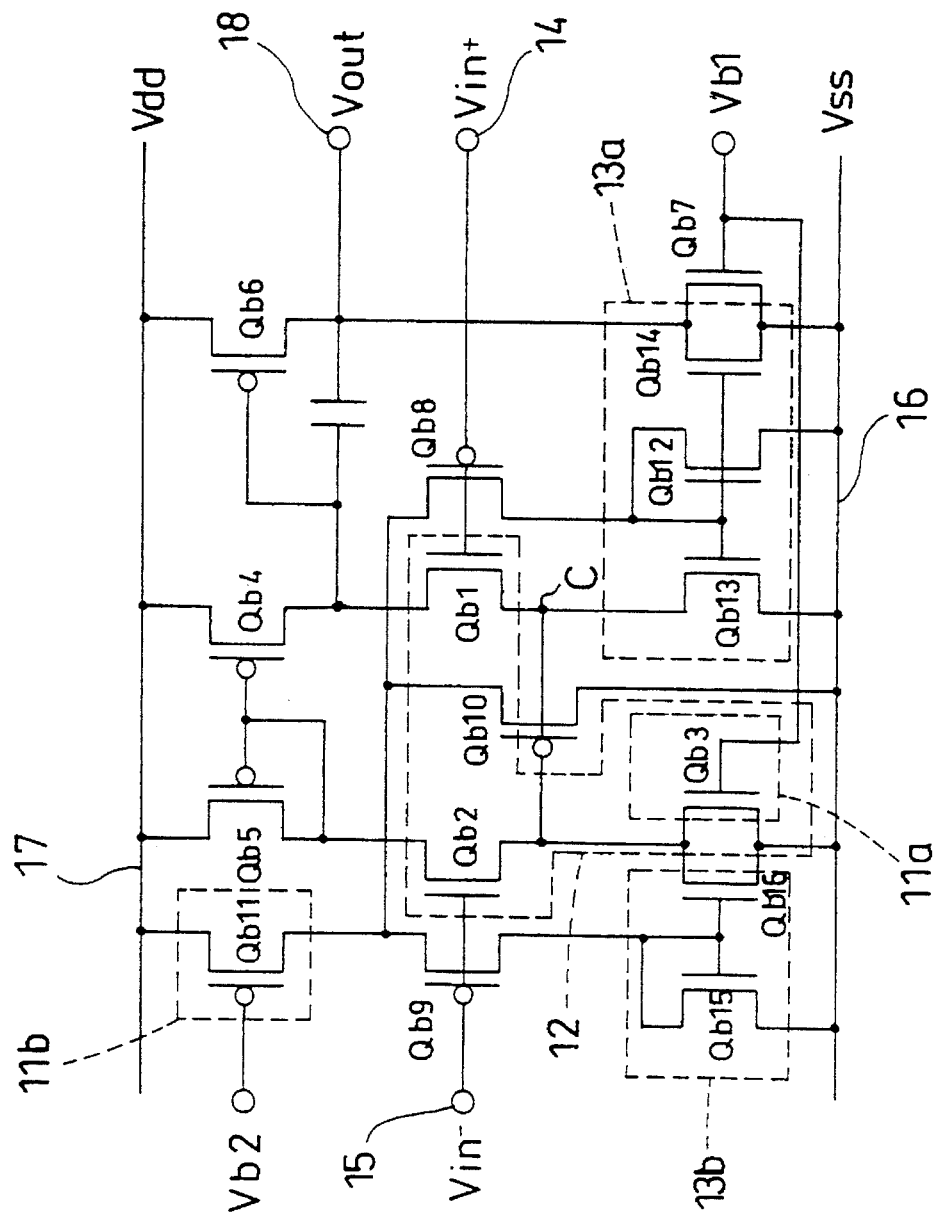
FIG. 2 is a wiring diagram showing a second op amp of the present invention.

Referring now to FIG. 2, a second embodiment of the present invention is described below. In this embodiment, a differential input stage 12 has a differential pair of NMOS transistors Qb1 and Qb2.

As shown in FIG. 2, the first and second transistors, i.e., Qb1 and Qb2, are connected together source-to-source. These transistors Qb1 and Qb2 are brought into connection with a first constant-current source 11a formed by an NMOS transistor Qb3 with a gate at which the bias voltage $V_{b1}$ is applied. These three transistors Qb1, Qb2, and Qb3 make up the differential input stage 12 of the first stage. PMOS transistors Qb4 and Qb5 make up an active load for the differential input stage 12. A transistor Qb6 of the PMOS type and a transistor Qb7 of the NMOS type make up an inverter amplifier of the second stage. A third, a fourth, and a fifth transistor of the PMOS type, i.e., Qb8, Qb9, and Qb10, are connected together source-to-source. These transistors QbS, Qb9, and Qb10 are brought into connection with a second constant-current source 11b formed by a PMOS transistor Qb11 with a gate at which the bias voltage $V_{b2}$ is applied. A first current mirror circuit 13a is made up of NMOS transistors Qb12, Qb13, and Qb14. A second current mirror circuit 13b is made up of NMOS transistors Qb15 and Qb16. The gates of Qb1 and Qb8 are connected with a noninverting input terminal 14. The gates of Qb2 and Qb9 are connected with an inverting input terminal 15. The gate of Qb10 is connected with the sources of Qb1 and Qb2. A junction between the sources of Qb1 and Qb2 is a node C. 16 is a low-level power supply source. 17 is a high-level power supply source. $V_{in+}$ is the noninverting input voltage. $V_{in-}$ is the inverting input voltage. $V_{out}$ is the output voltage. $V_{dd}$ is the high-level supply voltage. $V_{ss}$ is the low-level supply voltage.

If a virtual short holds thereby equalizing $V_{in+}$ and $V_{in-}$, then the voltage of the node C becomes lower than $V_{in+}$ by the gate-to-source voltage of Qb1. In other words, the voltage of the node C becomes lower than $V_{in-}$ by the gate-to-source voltage of Qb2. As a result, all the bias current from the second constant-current source 11b flows into Qb10. Accordingly, the transistors Qb8 and Qb9 turn off and no current flows in the first and second current mirror circuits 13a, 13b. The differential input stage 12 of the first stage is biased by a given bias current through Qb3. The inverter amplifier of the second stage is biased by a given bias current through Qb7. Even when $V_{in+}$ and $V_{in-}$ change in common mode, such a state is always maintained.

If $V_{in+}$ goes up in relation to $V_{in-}$, then the voltage of the node C increases with $V_{in+}$. The transistor Qb10 is then cut off, and a bias current through Qb11 comes to flow into Qb9. A current proportional to the current flowing in Qb9 is added by the second current mirror circuit 13b to the current of the first constant-current 11a of the differential input stage 12. Because of this, the output rises at high speed.

Conversely, if $V_{in+}$ goes down in relation to $V_{in-}$, then the transistor Qb10 is cut off, and a bias current through Qb11 comes to flow into Qb8. A current proportional to the current flowing in Qb8 is added by the first current mirror circuit 13a to the current of the first constant-current source 11a of the differential input stage 12 and to the current of Qb7 acting as a constant-current source. Because of this, the output falls at high speed.

In accordance with the present embodiment, the differential input stage 12 and the inverter amplifier are biased by a given current if $V_{in+}=V_{in-}$. Additionally, only when a great electric potential is produced between $V_{in+}$ and $V_{in-}$, a current proportional to such an electric potential is added to the bias current of the differential input stage 12 and to the bias current of the inverter amplifier. That is, larger electric potential causes larger current to be added to the bias current and smaller electric potential causes smaller current to be added to the bias current. As a result of such arrangement, it is possible to substantially improve the slew rate with no substantial increase in the power consumption and no degradation of the small-signal characteristics. Further, the present embodiment can provide a smaller op amp in comparison with the aforesaid second solution. Furthermore, unlike the second solution in which the bias current increases suddenly, in the present embodiment it increases according to the difference in the input voltage. Accordingly the degradation of settling characteristics and the generation of noise can be prevented.

In the present embodiment, the transistors Qb1 and Qb2, as the differential pair of the differential input stage 12, are NMOS transistors. However, this is not to be considered restrictive. PMOS transistors may be used instead of employing NMOS transistors as a differential pair, with the same effects. When using PMOS transistors as a differential pair, every transistor of FIG. 2 should be reversed in polarity, and the low-level power supply source should be converted into a high-level one while the high-level power supply source into a low-level one.

Figure 12:
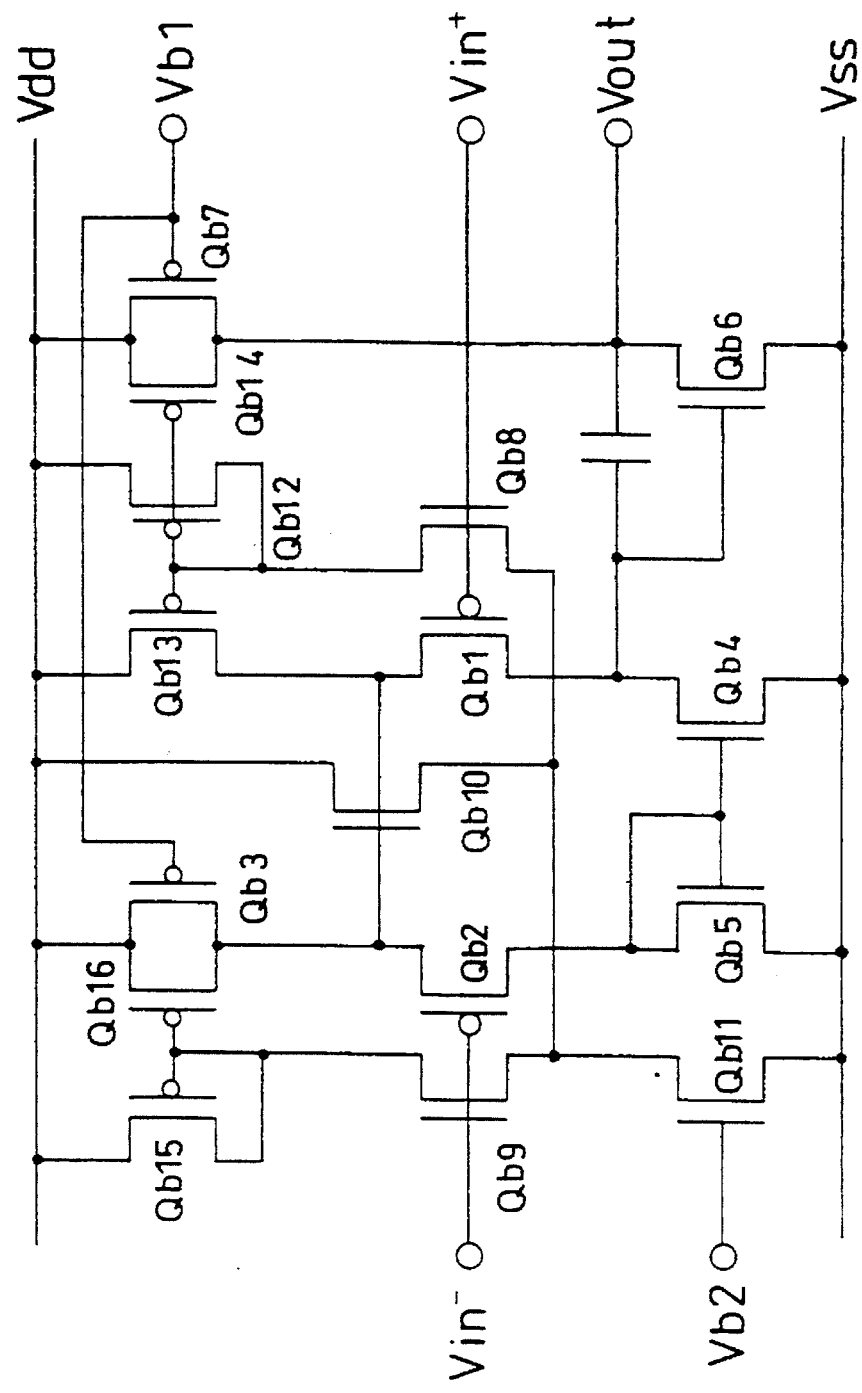
FIG. 12 shows an example of the second op amp using two PMOS transistors as a differential-input-stage transistor pair.

FIG. 12 shows an op amp using two PMOS transistors as the differential pair of Qb1 and Qb2 of the differential input stage 12. In FIG. 12 op amp, corresponding transistors are assigned the same reference numerals, and their description is omitted.

Figure 13:
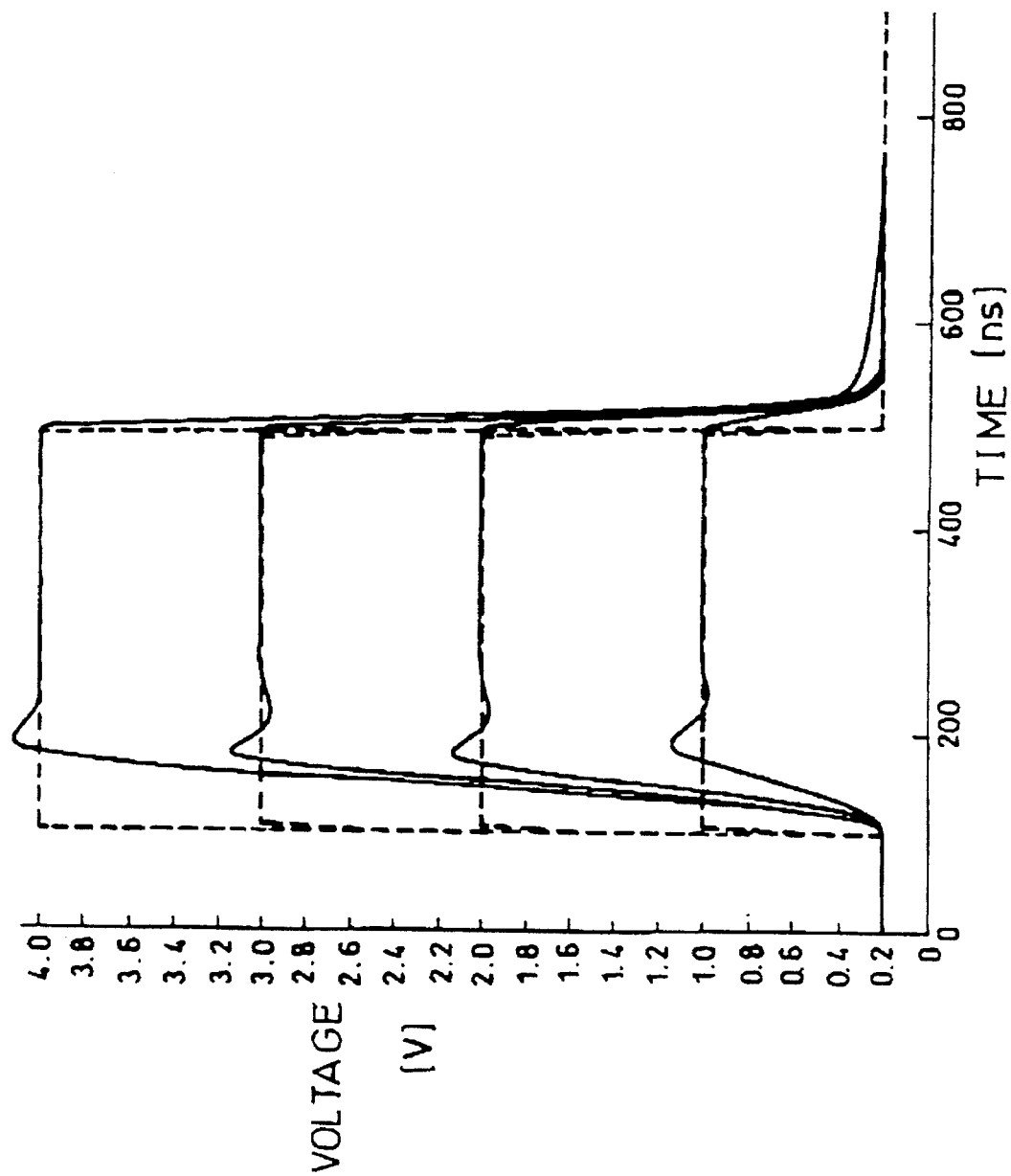
FIG. 13 shows input/output waveforms of the FIG. 12 op amp.

If the FIG. 12 op amp is used for a voltage follower, this permits the output, indicated by solid line, to respond at high speed to the input of square-shaped waves with very sharp rises and falls indicated by dot line (see FIG. 13). The steady-state current is 170 µA in this case.

Figure 21:
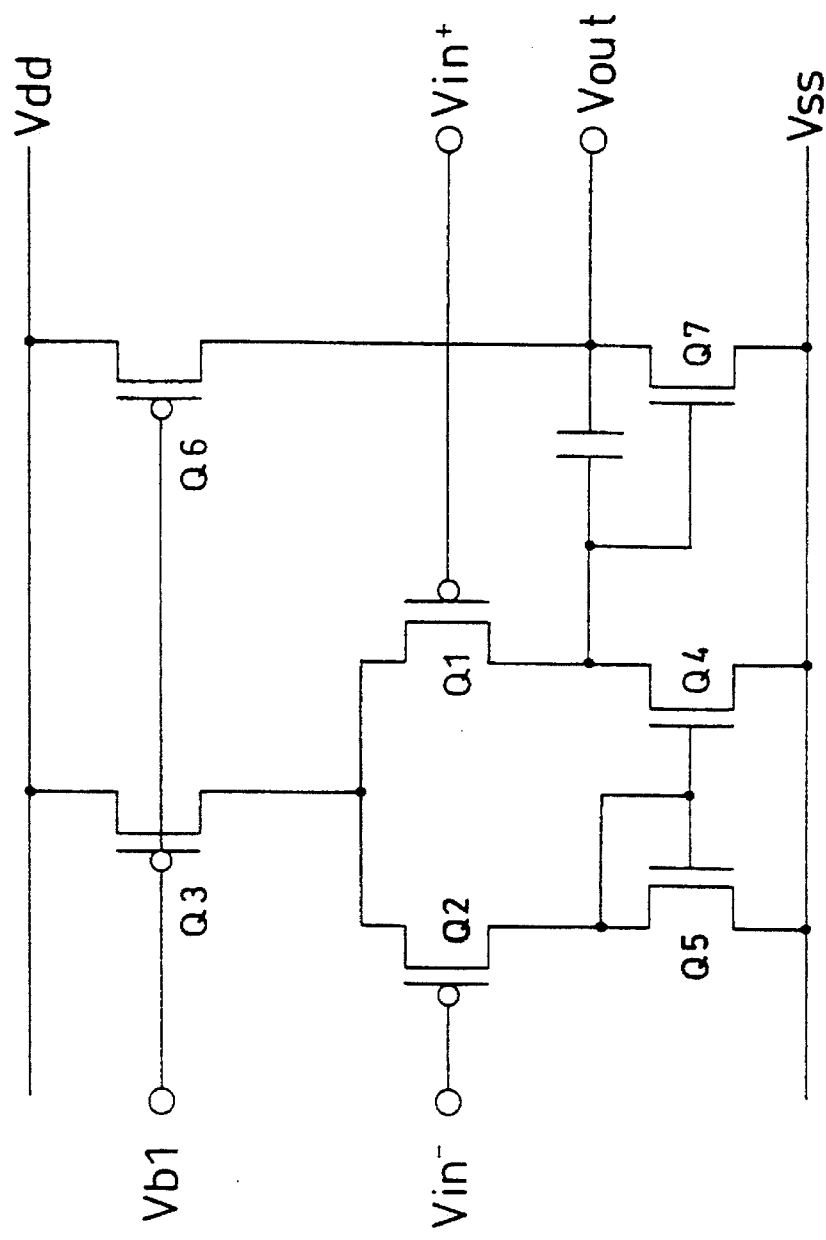
FIG. 21 shows a conventional op amp using two PMOS transistors as a differential-input-stage transistor pair.
Figure 22:
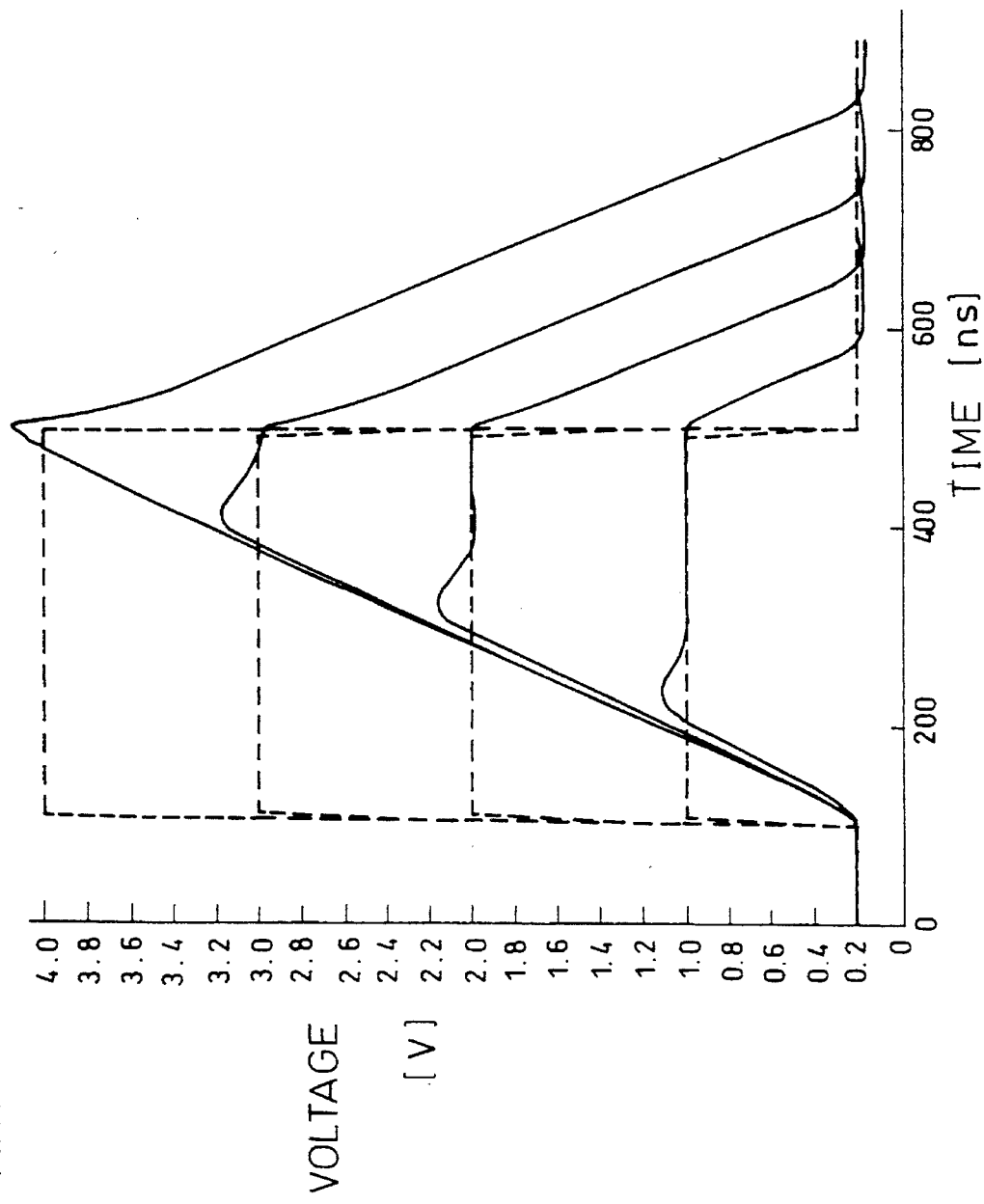
FIG. 22 shows input/output waveforms of the FIG. 21 op amp.

Square-shaped waves with very sharp rises and falls are inputted in the FIG. 21 conventional op amp that uses PMOS transistors as the differential pair of Q1 and Q2 of the differential input stage, for comparison with the present invention. The result shows that the output cannot catch up with the input, producing output waves with distortion as is shown in FIG. 22. The steady-state current is 150 µA in this case.

Figure 23:
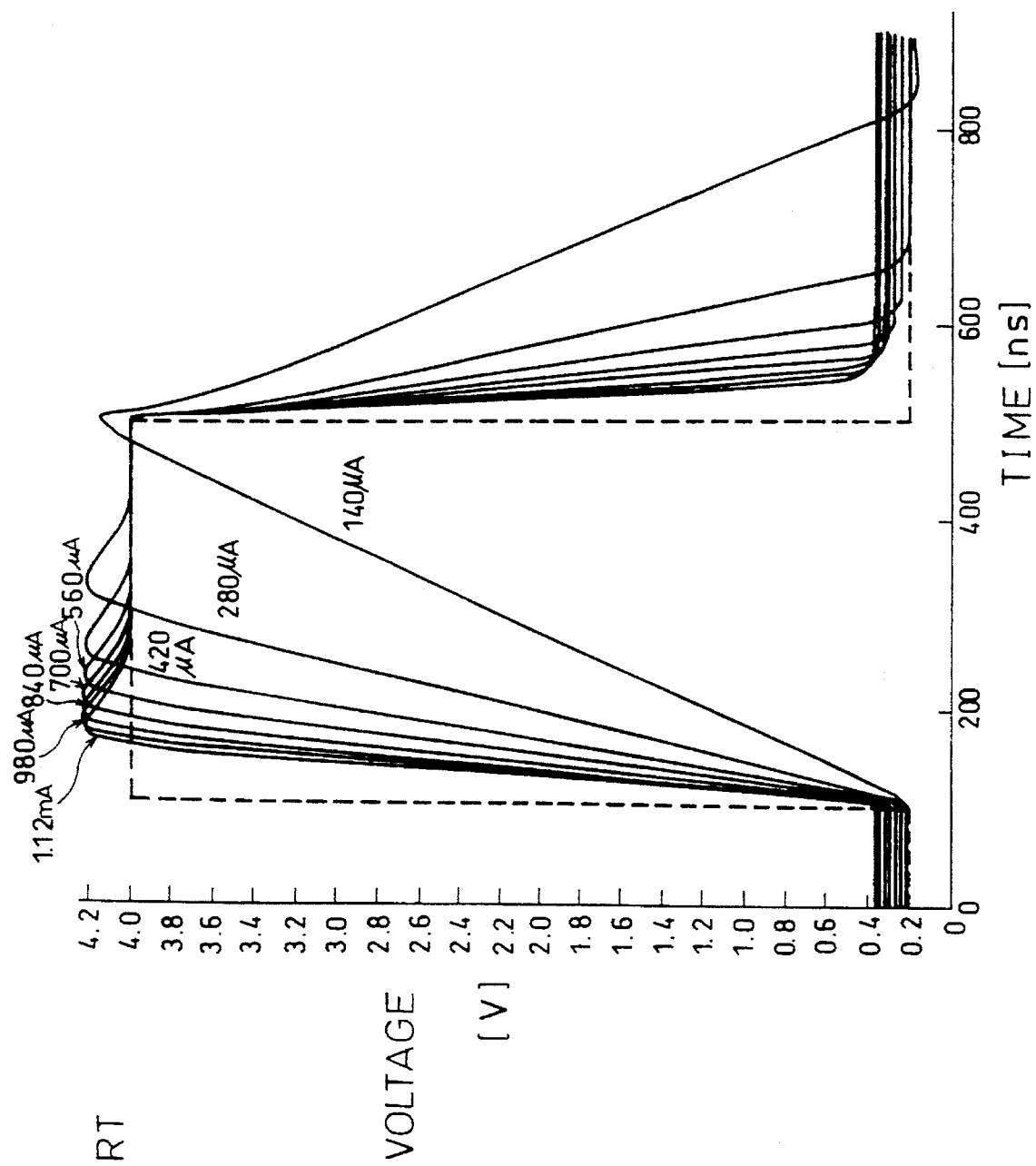
FIG. 23 shows the relationship of the output voltage and the steady-state current of the FIG. 21 op amp.

In order to obtain the same response rate as achieved by the FIG. 12 op amp, a steady-state current of about 1 mA is required in the case of the FIG. 21 conventional op amp (see FIG. 23). To sum up, a high-slew-rate op amp requiring a considerably less power can be realized by the present invention.

EMBODIMENT 3

Figure 3:
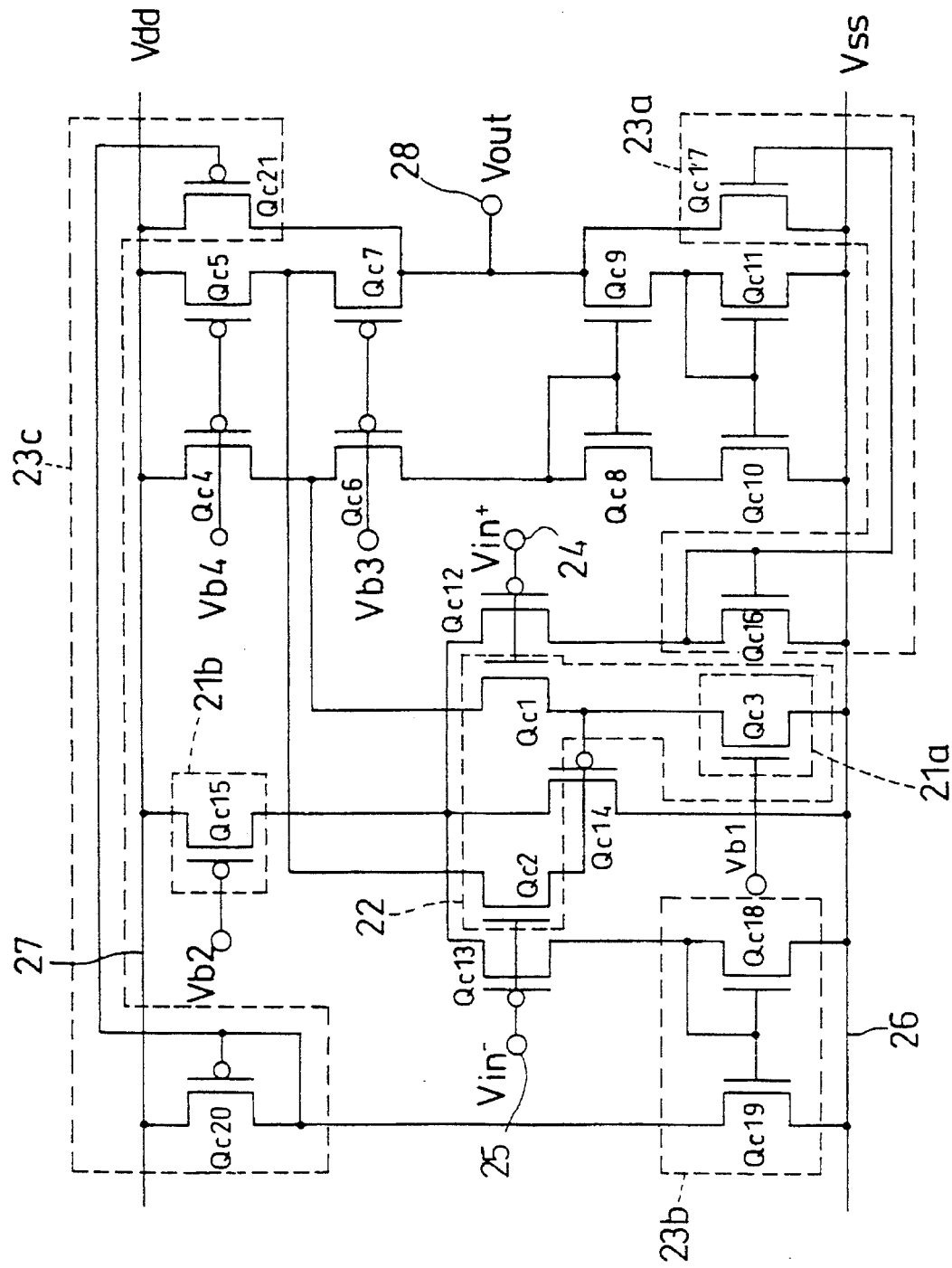
FIG. 3 is a wiring diagram showing a third op amp of the present invention.

A third embodiment of the present invention is described by making reference to FIG. 3. In this embodiment, a differential input stage 22 has a differential pair of NMOS transistors Qc1 and Qc2.

As shown in FIG. 3, the first and second transistors Qc1 and Qc2 are connected together source-to-source. These transistors Qc1 and Qc2 are brought in connection with a first constant-current source 21a formed by an NMOS transistor Qc3 with a gate at which $V_{b1}$ (i.e., the bias voltage) is applied. These three transistors Qc1, Qc2, and Qc3 make up the differential input stage 22. PMOS transistors Qc4 and Qc5 with gates at which a given bias voltage $V_{b4}$ is applied make up a constant-current source. This constant-current source performs biasing of a load formed by PMOS transistors Qc8, Qc9, Qc10, and Qc11 via a cascode stage of PMOS transistors Qc6 and Qc7 with gates at which a given bias voltage $V_{b3}$ is applied. In other words, a folded-cascode-type op amp is made up of transistors to Qc11. A third, a fourth, and a fifth transistor of the PMOS type, i.e., Qc12, Qc13, and Qc14, are connected together source-to-source. These three transistors Qc12, Qc13, and Qc14 are connected with a second constant-current source 21b formed by a PMOS transistor Qc15 with a gate at which $V_{b2}$ is applied. A first current mirror circuit 23a is formed by NMOS transistors Qc16 and Qc17. A second current mirror circuit 23b is formed by NMOS transistors Qc18 and Qc19. A third current mirror circuit 23c is formed by PMOS transistors Qc20 and Qc21. The gates of Qc1 and Qc12 are connected with a noninverting input terminal 24. The gates of Qc2 and Qc13 are connected with an inverting input terminal 25. The gate of Qc14 is connected with the sources of Qc1 and Qc2.

If $V_{in+}$ goes up in relation to $V_{in-}$, then the transistor Qc14 is cut off and a bias current through Qc15 comes to flow into Qc13. A current proportional to the current flowing in Qc13 is injected by the second current mirror circuit 23b into the third current mirror circuit 23c. The third current mirror circuit 23c then injects a current proportional to the input current into an output terminal 28. Accordingly the output voltage $V_{out}$ rises at high speed.

Conversely, if $V_{in+}$ goes down in relation to $V_{in-}$, then the transistor Qc14 is cut off, and a bias current through Qc15 comes to flow into Qc12. A current proportional to the current flowing in Qc12 is injected by the first current mirror circuit 23a into the output terminal 28. As a result, the output voltage $V_{out}$ falls at high speed.

In accordance with the present embodiment, only when an electric potential is produced between $V_{in+}$ and $V_{in-}$, a current proportional to the electric potential is injected into the output terminal 28 in such a way as to cancel the electric potential. That is, larger electric potential causes larger current to flow into the output terminal 28 and smaller electric potential causes smaller current to flow into the output terminal 28. As a result of such arrangement, it is possible to substantially improve the slew rate with no substantial increase in the power consumption and no degradation of the small-signal characteristics.

In the present embodiment, the transistors Qc1 and Qc2, as the differential pair of the differential input stage 22, are NMOS transistors. However, this is not to be considered restrictive. PMOS transistors may be used instead of employing NMOS transistors as a differential pair, with the same effects. When using PMOS transistors as a differential pair, every transistor of FIG. 3 should be reversed in polarity, and the low-level power supply source should be converted into a high-level one while the high-level power supply source into a low-level one.

EMBODIMENT 4

Figure 4:
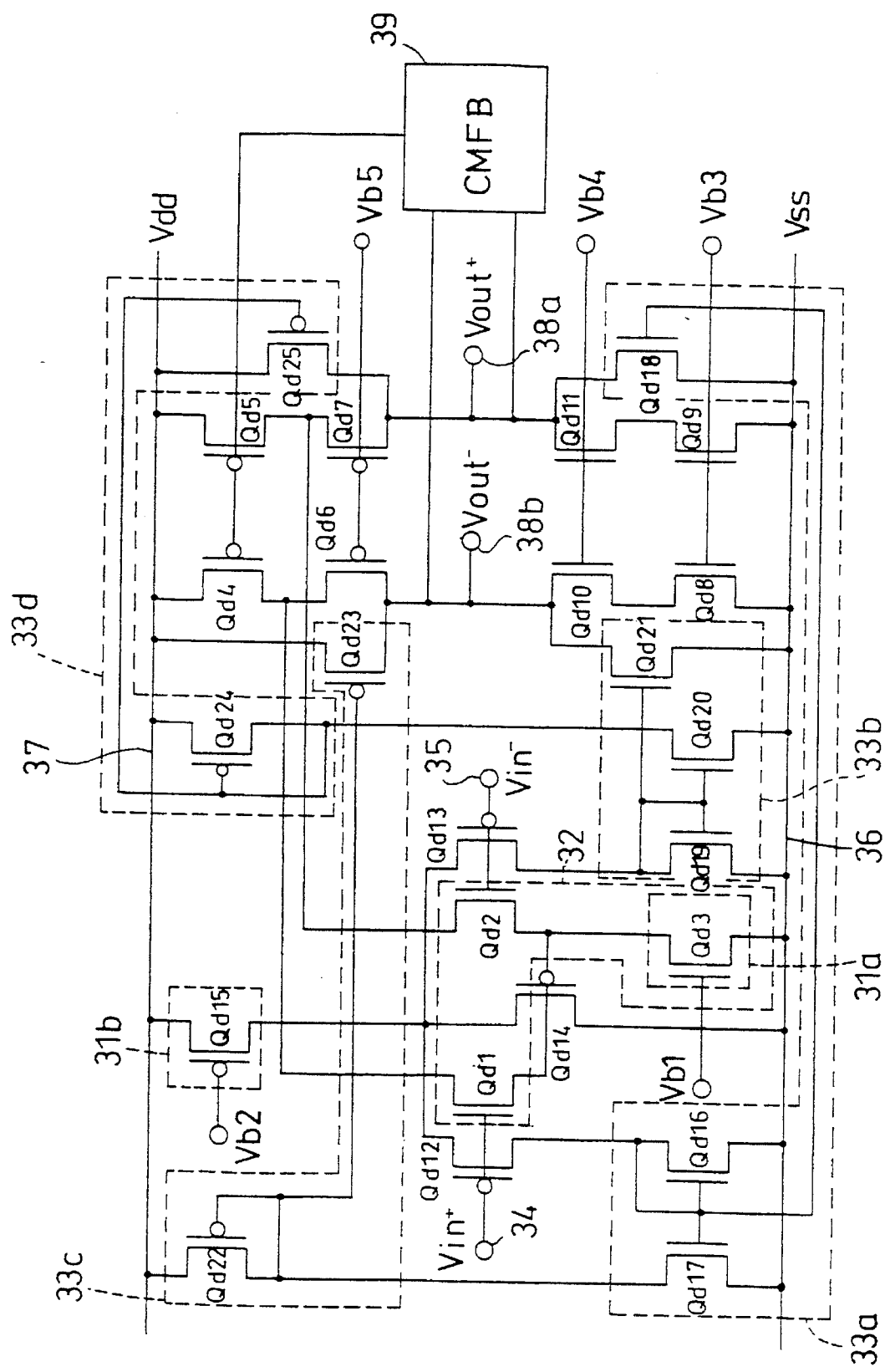
FIG. 4 is a wiring diagram showing a fourth op amp of the present invention.

A fourth embodiment of the present invention is described by making reference to FIG. 4. In this embodiment, a differential input stage 32 has a differential pair of NMOS transistors Qd1 and Qd2.

As shown in FIG. 4, the first and second transistors, i.e., Qd1 and Qd2, are connected together source-to-source. These transistors Qd1 and Qd2 are brought in connection with a first constant-current source 31a formed by an NMOS transistor Qd3 with a gate at which $V_{b1}$ (i.e., the bias voltage) is applied. These three transistors Qd1, Qd2, and Qd3 make up the differential input stage 32. PMOS transistors Qd4 and Qd5, which are biased by the output of a common mode feed back (CMFB) circuit 39 that inputs two differential output voltages, perform biasing of a load formed by a constant-current source of NMOS transistors Qd8 and Qd9 with gates at which $V_{b3}$ is applied and a cascode stage of NMOS transistors Qd10 and Qd11 with gates at which a given bias voltage $V_{b4}$ is applied, via a cascode stage formed by PMOS transistors Qd6 and Qd7 with gates at which a given bias voltage $V_{b5}$ is applied. In other words, the transistors Qd1–Qd11 make up a fully differential folded cascode type op amp. A third, a fourth, and a fifth transistor of the PMOS type, i.e., Qd12, Qd13, and Qd14, are connected together source-to-source. These three PMOS transistors are connected with a second constant-current source 31b formed by a PMOS transistor Qd15 with a gate at which $V_{b2}$ (i.e., the bias voltage) is applied. A first current mirror circuit 33a is formed by NMOS transistors Qd16, Qd17, and Qd18. A second current mirror circuit 33b is formed by NMOS transistors Qd19, Qd20, and Qd21. A third current mirror circuit 33c is formed by PMOS transistors Qd22 and Qd23. A fourth current mirror circuit 33d is formed by PMOS transistors Qd24 and Qd25. The gates of Qd1 and Qd12 are connected with a noninverting input terminal 34. The gates of Qd2 and Qd13 are connected with an inverting input terminal 35. The gate of Qd14 is connected with the sources of Qd1 and Qd2. 36 is a low-level power supply source. 37 is a high-level power supply source. 38a is a noninverting output terminal. 38b is an inverting output terminal. $V_{in+}$ is the noninverting input voltage. $V_{in-}$ is the inverting input voltage. $V_{out+}$ is the noninverting output voltage. $V_{out-}$ is the inverting output voltage. $V_{dd}$ is the high-level supply voltage. $V_{ss}$ is the low-level supply voltage.

If $V_{in+}$ goes up in relation to $V_{in-}$, then Qd14 is cut off and a bias current through Qd15 comes to flow into Qd13. A current proportional to the current flowing in Qd13 is applied by the second current mirror circuit 33b to the fourth current mirror circuit 33d and is injected into the inverting output terminal 38b. In response, the fourth current mirror circuit 33d injects a current proportional to the input current into the noninverting output terminal 38a. As a result, the inverting output falls at high speed, and the noninverting output rises at high speed.

Conversely, if $V_{in+}$ goes down in relation to $V_{in-}$, then Qd14 is cut off and a bias current through Qd15 comes to flow into Qd12. A current proportional to the current flowing in Qd12 is applied by the first current mirror circuit 33a to the third current mirror circuit 33c and is injected into the noninverting output terminal 38a. In response, the third current mirror circuit 33c injects a current proportional to the input current into the inverting output terminal 38b. As a result, the noninverting output falls at high speed, and the inverting output rises at high speed.

In accordance with the present embodiment, only when a great electric potential is produced between $V_{in+}$ and $V_{in-}$, a current proportional to the electric potential is injected into the noninverting output terminal 38a and into the inverting output terminal 38b in such a way as to cancel the electric potential. That is, larger electric potential causes larger current to flow and smaller electric potential causes smaller current to flow. As a result of such arrangement, it is possible to substantially improve the slew rate with no substantial increase in the power consumption and no degradation of the small-signal characteristics.

In the present embodiment, the transistors Qd1 and Qd2, as the differential pair of the differential input stage 32, are NMOS transistors. However, this is not to be considered restrictive. PMOS transistors may be used instead of employing NMOS transistors as a differential pair, with the same effects. When using PMOS transistors as a differential pair. Every transistor of FIG. 4 should be reversed in polarity, and the low-level power supply source should be converted into a high-level one while the high-level power supply source into a low-level one.

EMBODIMENT 5

Figure 5:
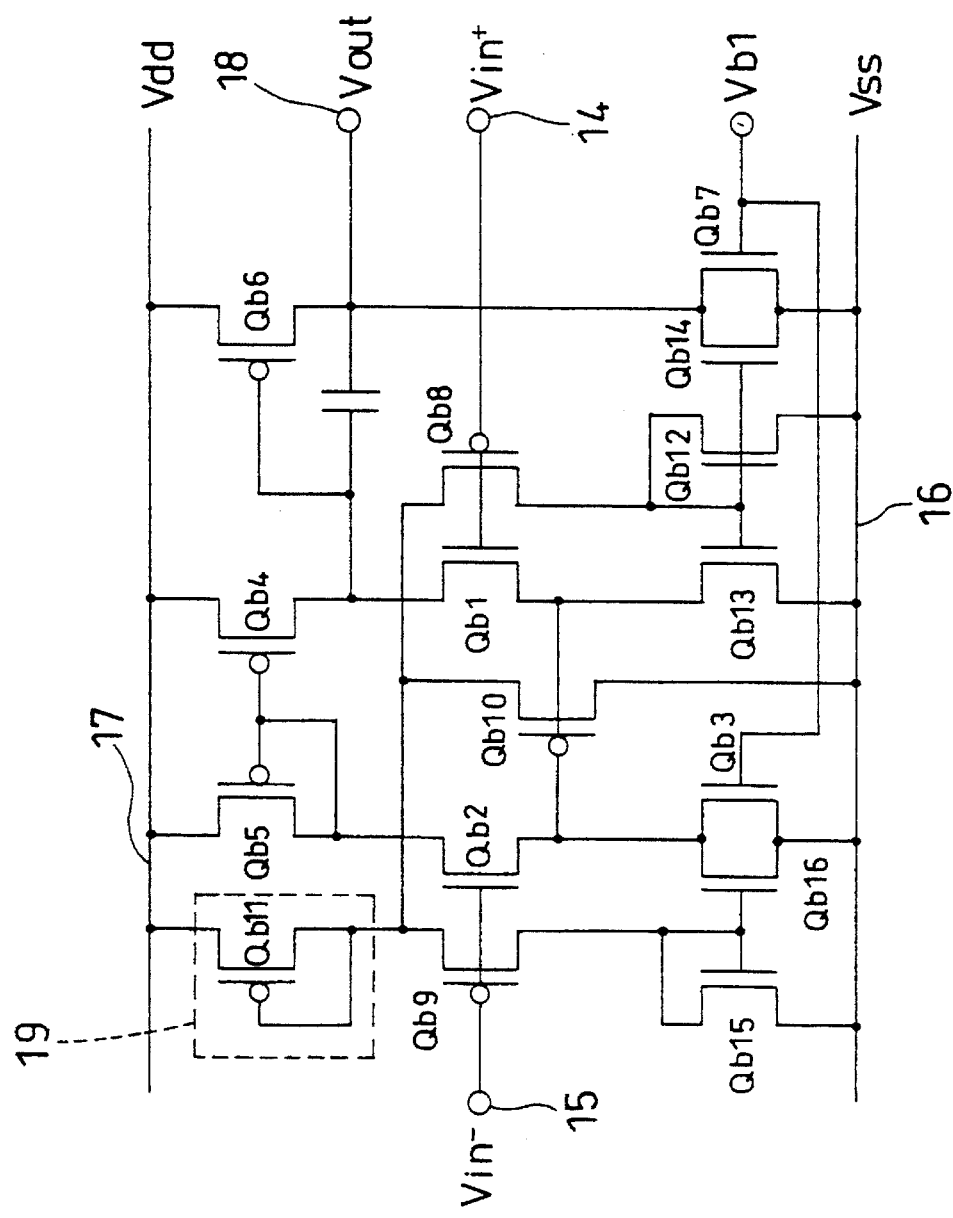
FIG. 5 is a wiring diagram showing a fifth op amp of the present invention.

Referring now to FIG. 5, a fifth embodiment of the present invention is described below.

The second embodiment op amp of FIG. 2 uses a PMOS transistor with a gate at which the bias voltage $V_{b2}$ is applied, as the second constant-current source. In the present embodiment, Qb11 whose drain and gate are connected together is used as a resistor 19. By replacing the second constant-current source of the second embodiment with such an equivalent (i.e., the resistor 19), the same effects as accomplished by the second embodiment can be obtained. This eliminates the need for generating an extra bias voltage, thereby eliminating the need for providing an extra bias circuit.

As described above, in the present embodiment, the second constant-current source of the FIG. 2 op amp is replaced by the resistor 19. This arrangement (i.e., the replacement of the second constant-current source with the resistor) may be applied to the first, third, and fourth embodiments, with the same effects.

EMBODIMENT 6

Figure 6:
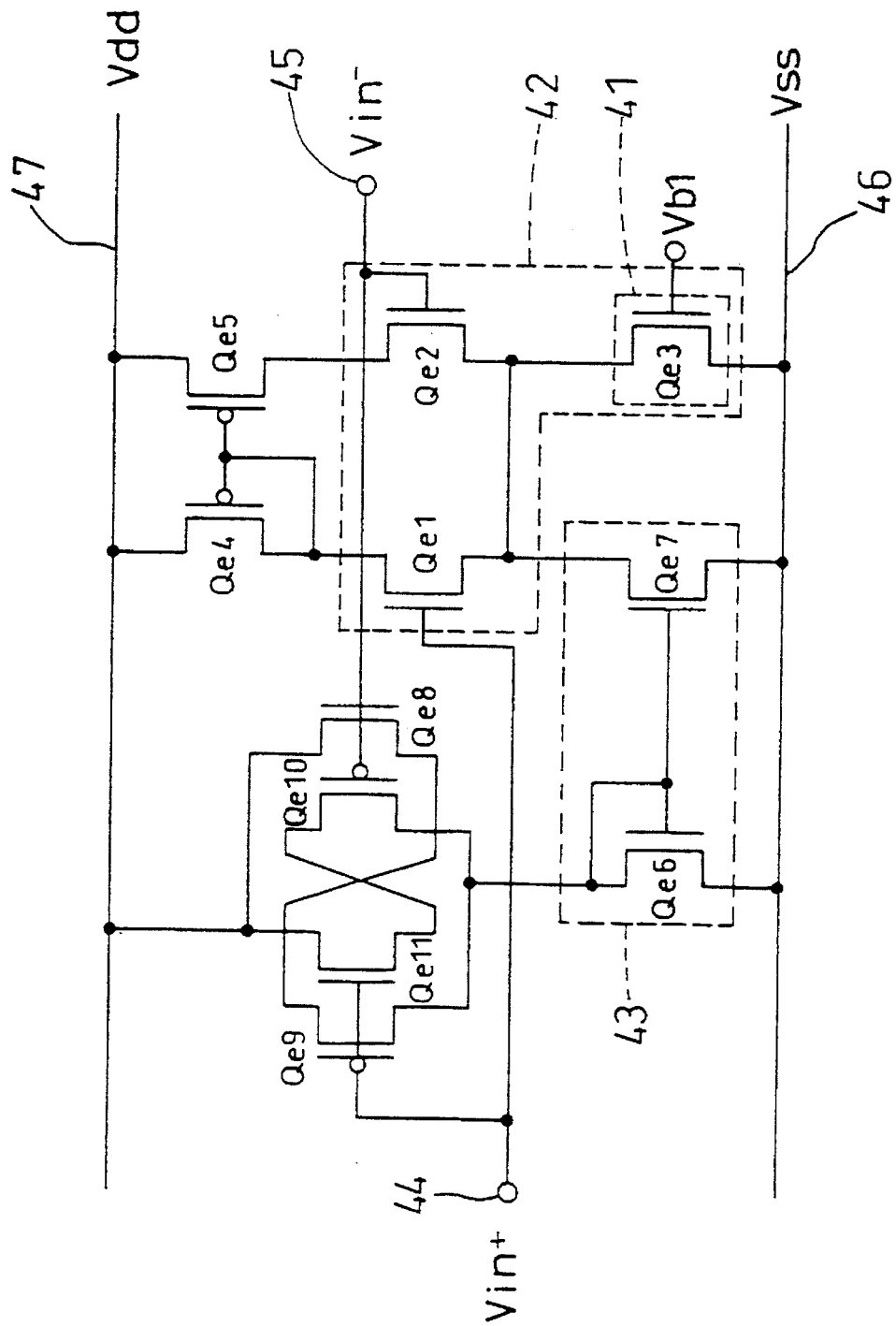
FIG. 6 is a wiring diagram showing a sixth op amp of the present invention.

A sixth embodiment of the present invention is described by making reference to FIG. 6. In this embodiment, a differential input stage 42 has a differential pair of NMOS transistors Qe1 and Qe2.

As shown in FIG. 6, the first transistor Qe1 and the second transistor Qe2 are connected together source-to-source. These transistors Qe1 and Qe2 are brought into connection with a constant-current source 41 formed by an NMOS transistor Qe3 with a gate at which the bias voltage $V_{b1}$ is applied. These three transistors Qe1, Qe2, and Qe3 make up the differential input stage 42. PMOS transistors Qe4 and Qe5 make up an active load for the differential input stage 42. NMOS transistors Qe6 and Qe7 jointly constitute a current mirror circuit 43. Qe8 (i.e., the third transistor of the NMOS type) and Qe9 (i.e., the fourth transistor of the PMOS type) are connected together source-to-source. Qe10 (i.e., the fifth transistor of the PMOS type) and Qe11 (i.e., the sixth transistor of the NMOS type) are connected together source-to-source. The drains of Qe9 and Qe10 are connected with the drain of Qe6 that is a diode-connected transistor. The drains of Qe8 and Qe11 are connected with a high-level power supply source 47. The gates of Qe9 and Qe11 are connected with a noninverting input terminal 44. The gates of Qe8 and Qe10 are connected with an inverting input terminal 45. The drain of Qe7 acting as the current mirror circuit 43 is connected with the sources of Qe1 and Qe2. 46 is a low-level power supply source. $V_{in+}$ is the noninverting input voltage. $V_{in-}$ is the inverting input voltage. $V_{dd}$ is the high-level supply voltage. $V_{ss}$ is the low-level supply voltage.

If $V_{in+}=V_{in-}$, Qe8 and Qe9, connected together source-to-source, and Qe10 and Qe11, connected together source-to-source, are cut off because the gate-to-source voltage is zero. No electric current flows. As a result, the differential input stage 42 is biased only by the current of the constant-current source 41 formed by Qe3.

If an electric potential is produced between $V_{in+}$ and $V_{in-}$ ($V_{in+}>V_{in-}$), and if such a potential exceeds a sum of $V_{tp}+V_{tn}$ where $V_{tp}$ is the threshold voltage of a PMOS transistor and $V_{tn}$ the threshold voltage of an NMOS transistor, this makes Qe10 and Qe11 turn on, whereupon a current proportional to the potential starts flowing. A current flowing in these transistors Qe10 and Qe11 is added by the current mirror circuit 43 to the bias current of the differential input stage 42.

If $V_{in-}>V_{in+}$, this makes the transistors Qe8 and Qe9 turn on and a current proportional to an electric potential between $V_{in+}$ and $V_{in-}$ starts flowing. A current flowing in these transistors Qe8 and Qe9 is added by the current mirror circuit 43 to the bias current of the differential input stage 42.

In accordance with the present embodiment, the slew rate improves remarkably and the increase in the power consumption at the steady state is held to zero.

In the present embodiment, Qe1 and Qe2, as the differential pair of the differential input stage 42, are NMOS transistors. However, this is not to be considered restrictive. PMOS transistors may be useful instead of NMOS transistors, with the same effects. In this case, every transistor of FIG. 6 should be reversed in polarity, and the low-level power supply source should be converted into a high-level one while the high-level power supply source into a low-level one.

Figure 14:
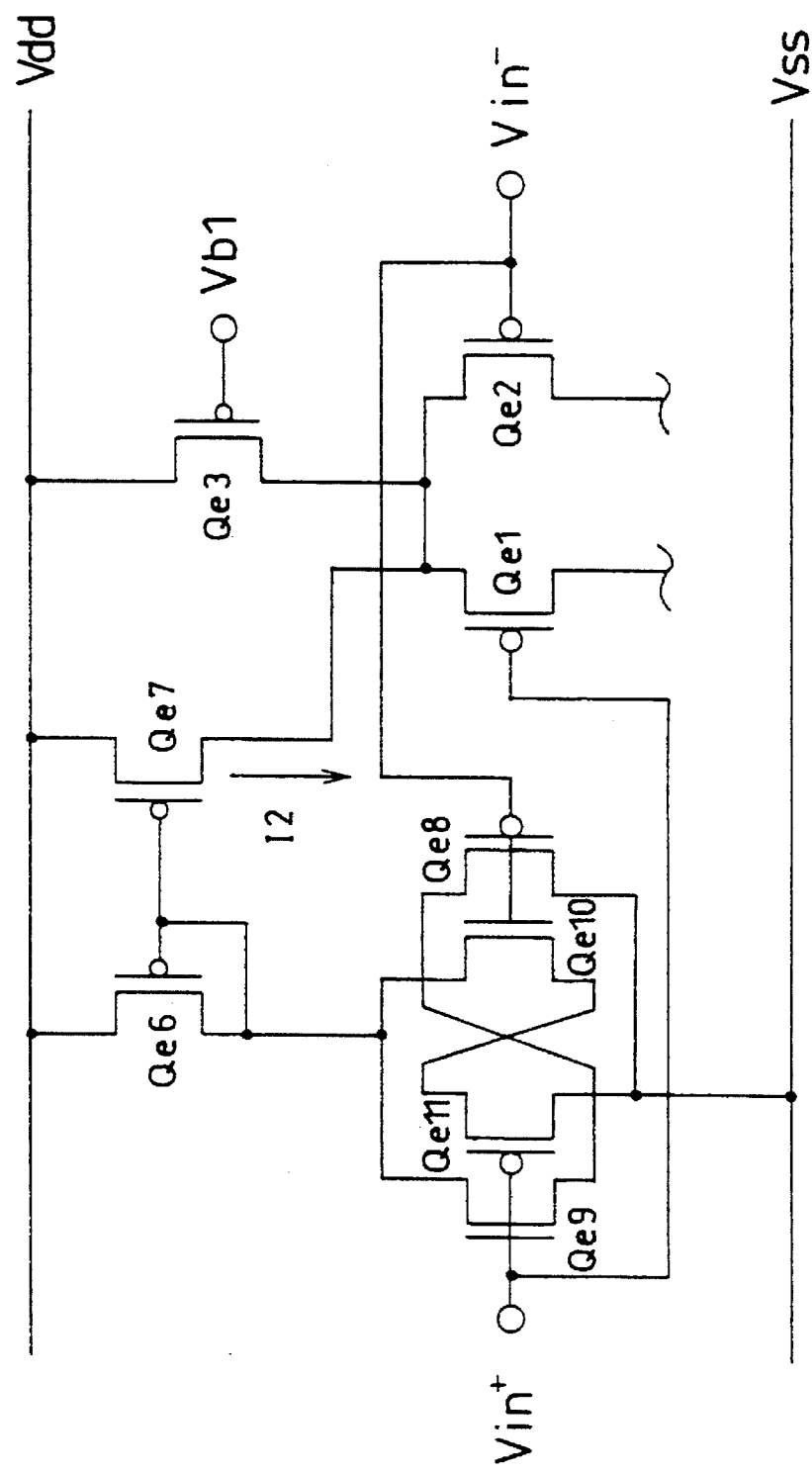
FIG. 14 shows an example of the sixth op amp using two PMOS transistors as a differential-input-stage transistor pair.

FIG. 14 shows an op amp employing PMOS transistors as the differential pair of Qe1 and Qe2 of the differential input stage 42. In FIG. 14 op amp, corresponding transistors are assigned the same reference numerals and their description is omitted. An active load for the differential input stage is not shown in the figure.

Figure 15:
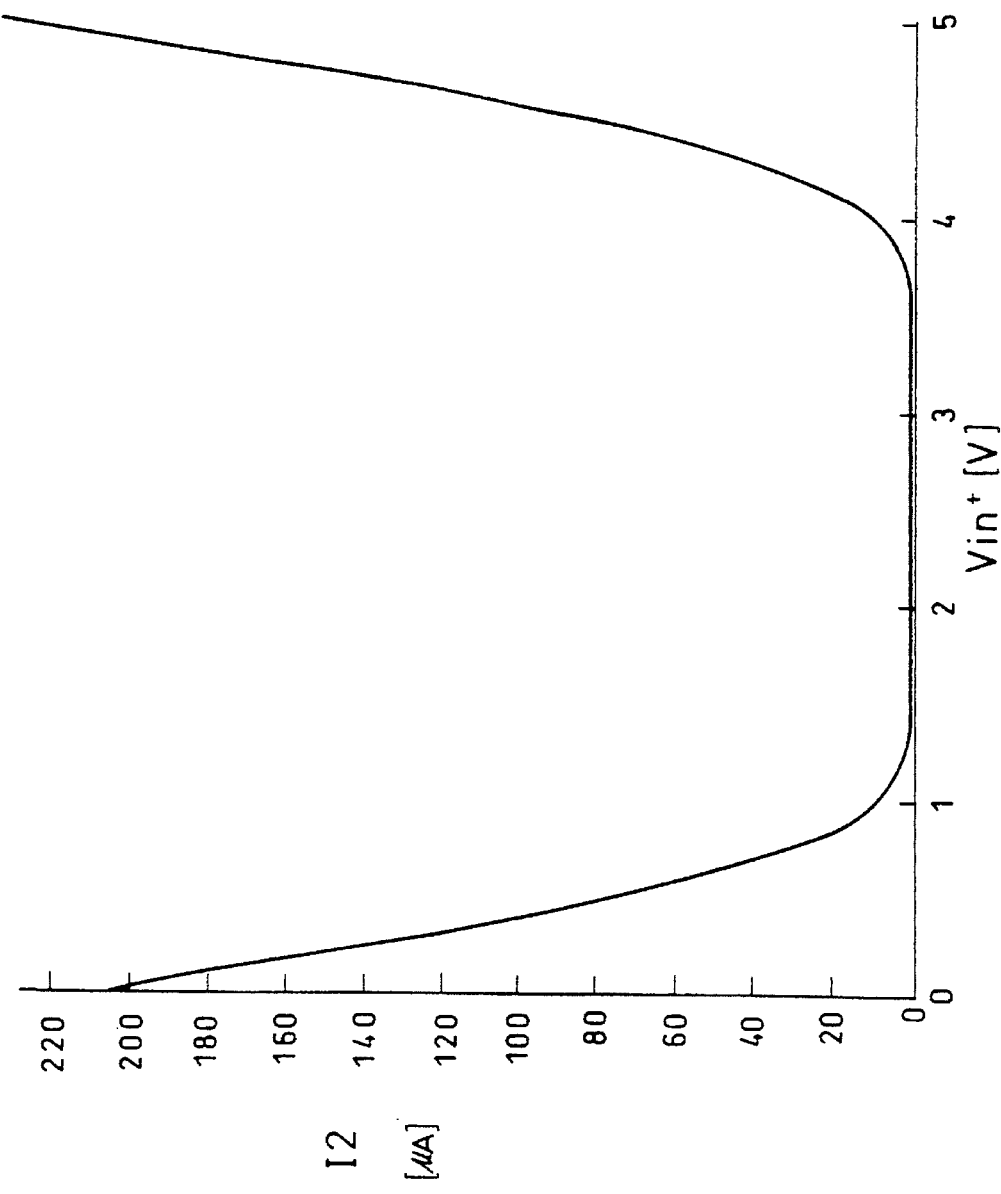
FIG. 15 is a graph showing the relationship of the current to be added to the bias current of the differential input stage versus the noninverting input voltage in the FIG. 14 op amp, when the value of the inverting input voltage is fixed.

In the FIG. 14 op amp, if $V_{in-}$ is fixed at 2.5 V and $V_{in+}$ changes from 0 V to 5 V, then, as shown in FIG. 15 a current I2 to be added to the bias current of the differential input stage starts flowing when an electric potential between $V_{in+}$ and $V_{in-}$ exceeds a sum of $V_{tp}+V_{tn}$. As a result, the same waveforms as produced by the FIG. 10 op amp are produced. However, it is impossible in this op amp to freely set the point at which the current I2 starts flowing.

Figure 16A:
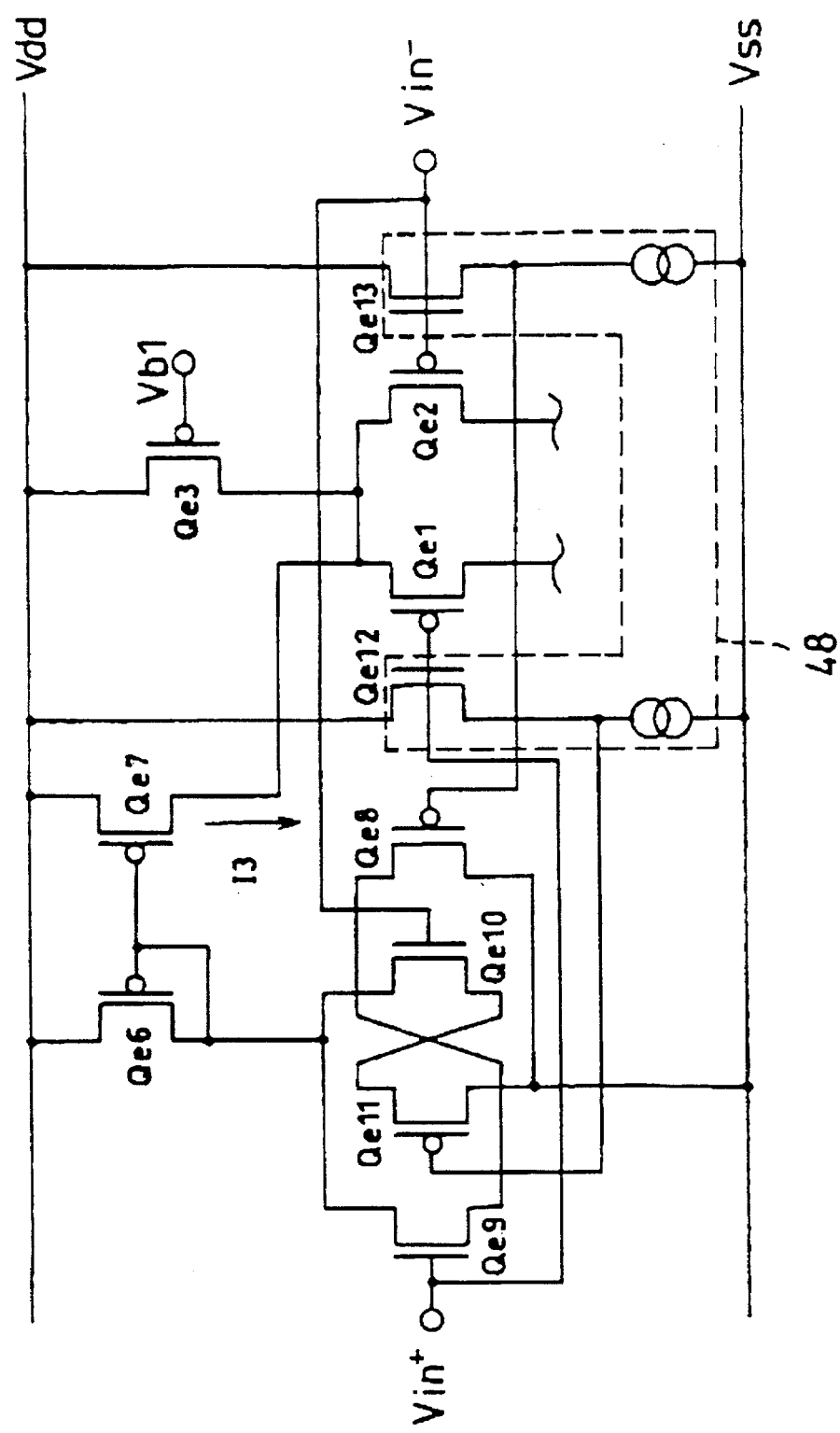
FIG. 16A is a wiring diagram showing a revision of the FIG. 14 op amp.
Figure 16B:
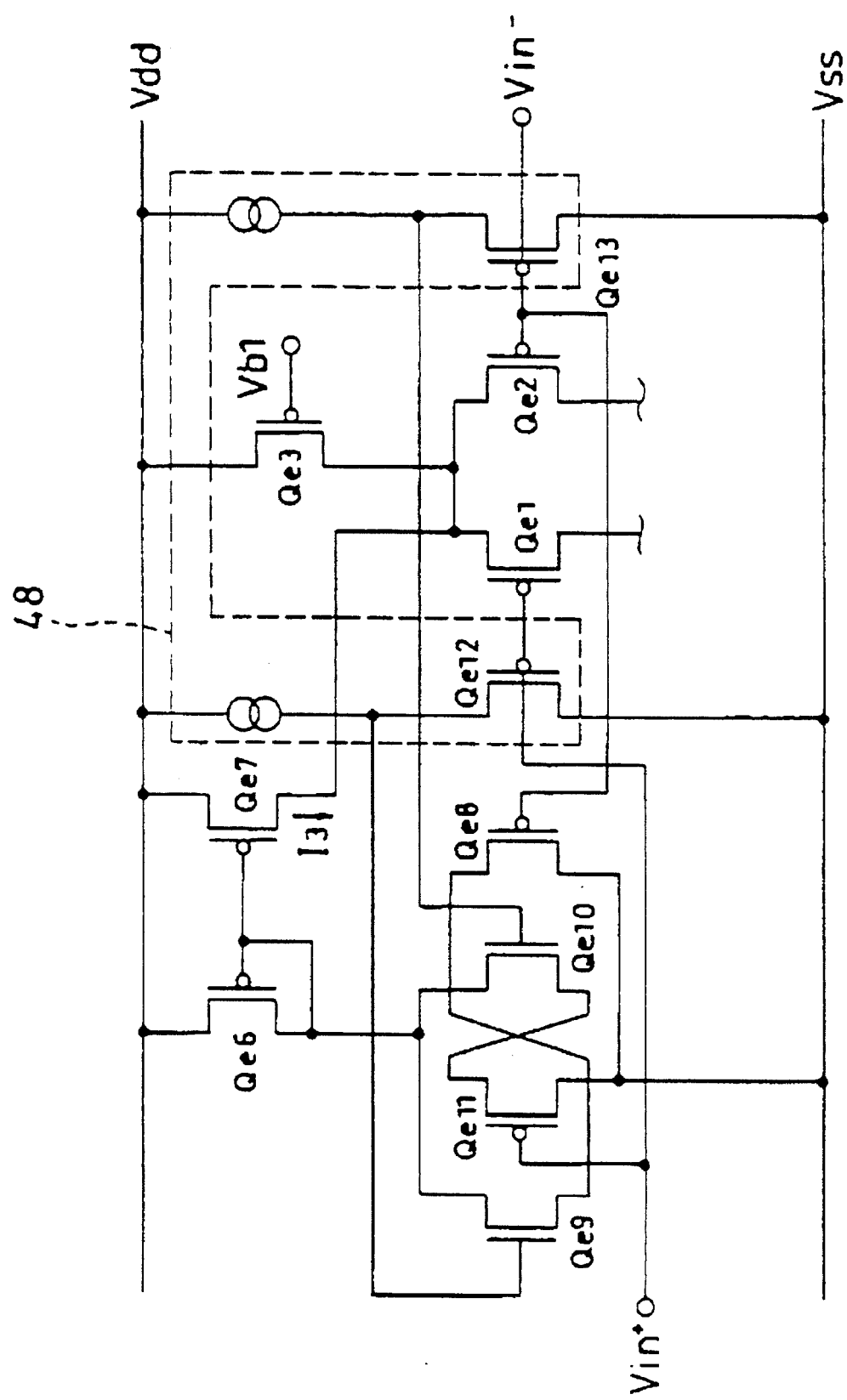
FIG. 16B is a wiring diagram showing another revision of the FIG. 14 op amp.
Figure 17:
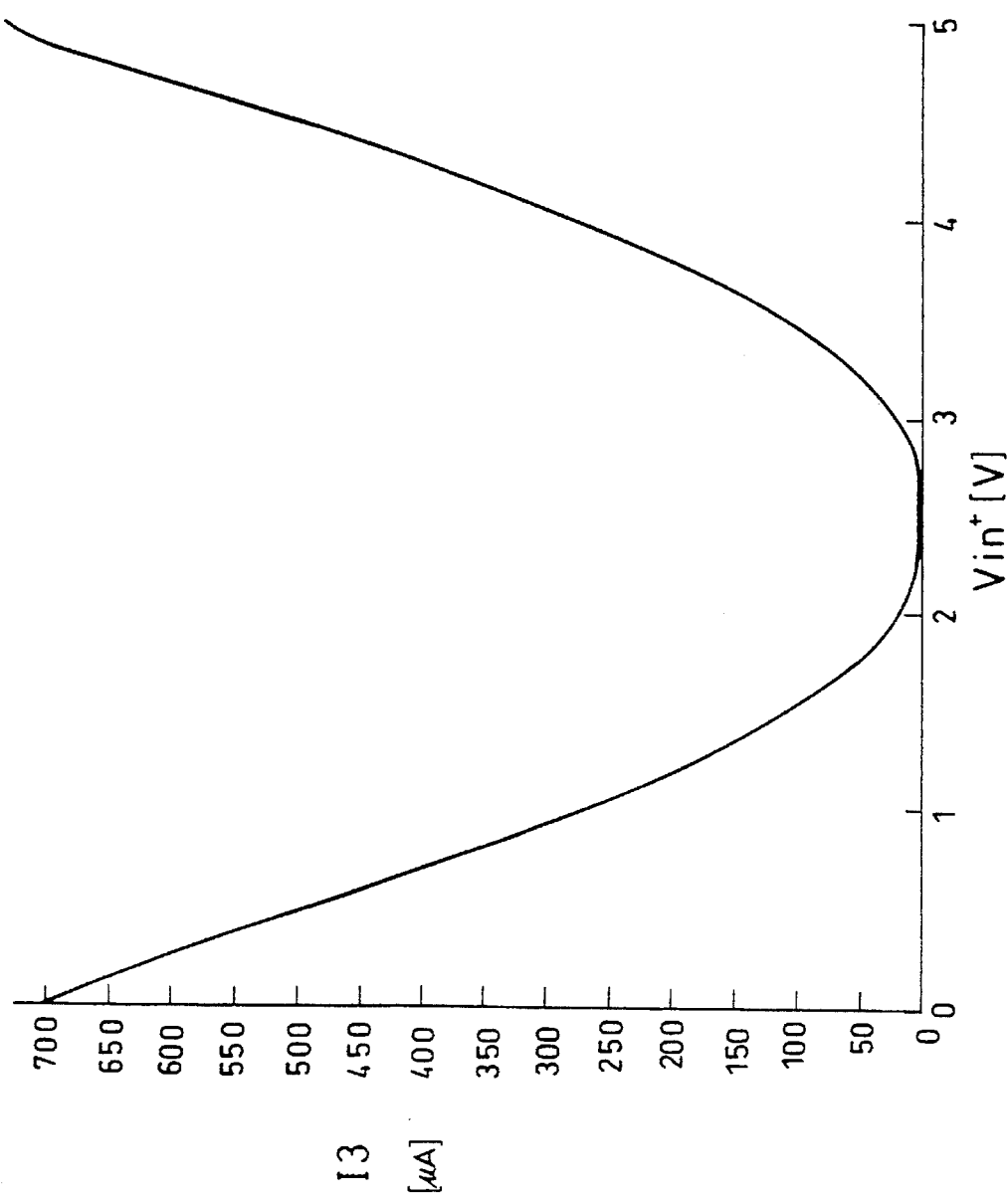
FIG. 17 is a graph showing the relationship of the current to be added to the bias current of the differential input stage versus the noninverting input voltage in the FIG. 16 op amp, when the value of the inverting input voltage is fixed.
Figure 18:
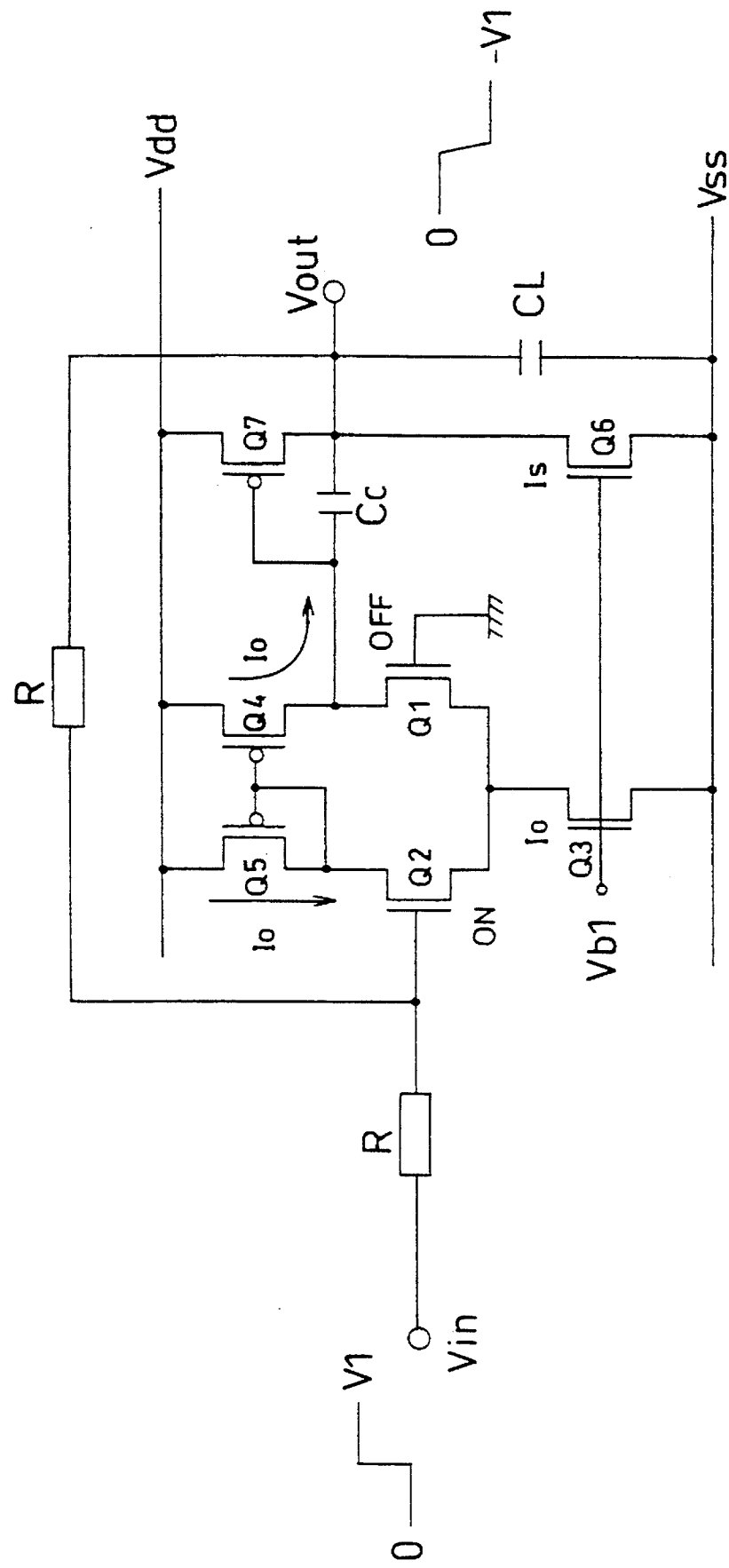
FIG. 18 is a wiring diagram showing a conventional operational amplifier.
Figure 19:
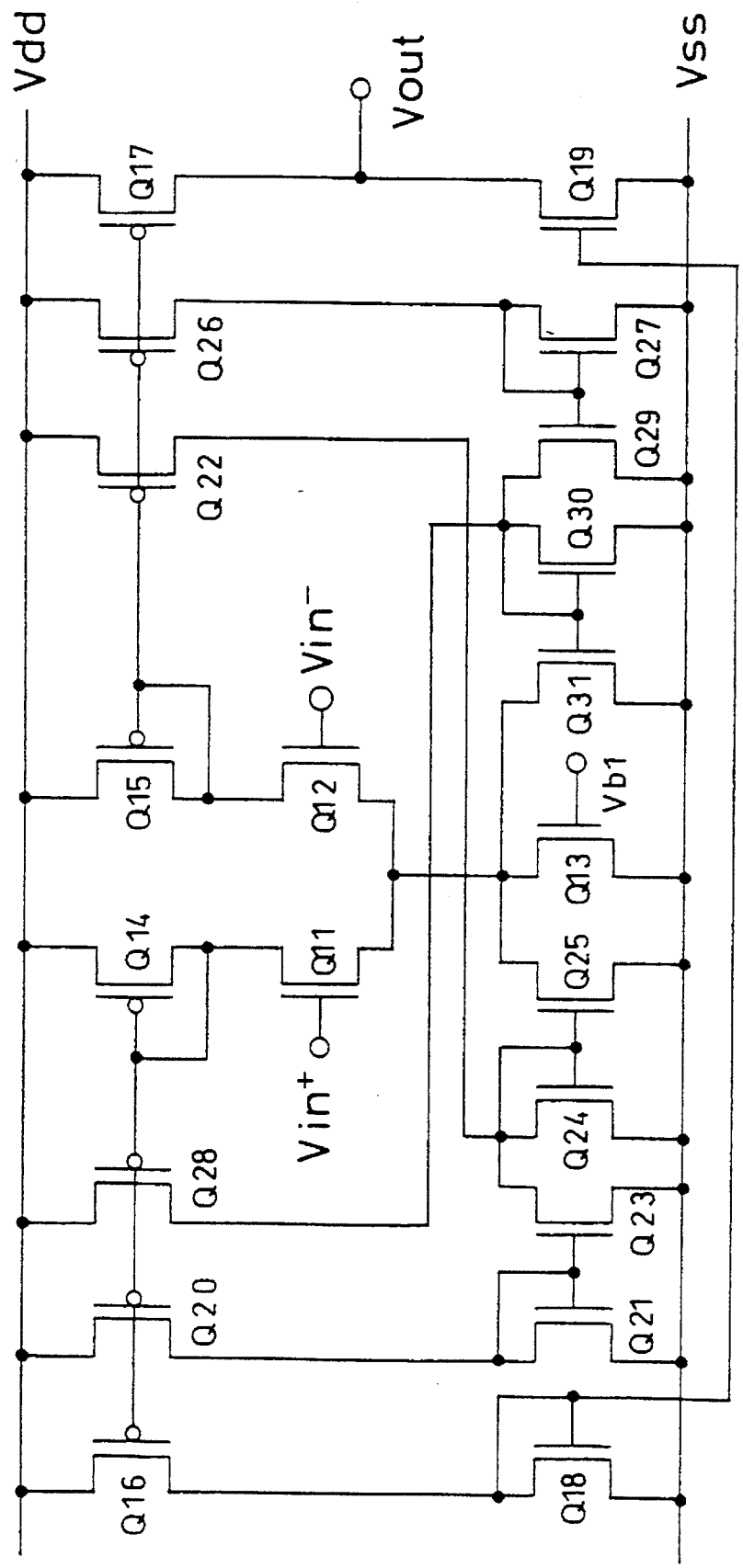
FIG. 19 shows a first solution to the problems associated with the conventional op amp.
Figure 20:
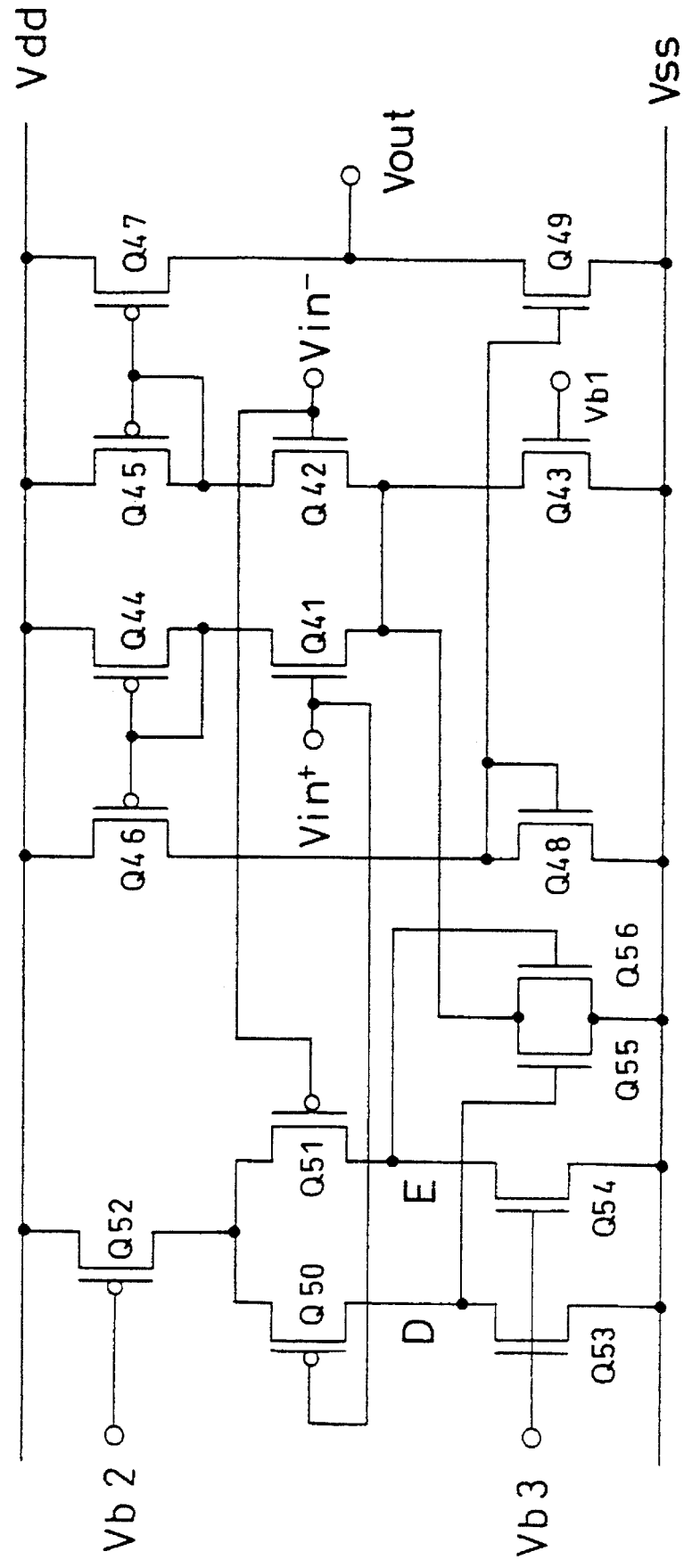
FIG. 20 shows a second solution.

If Qe12 and Qe13 of the PMOS type, i.e., a source follower, is added to the FIG. 14 op amp (see FIGS. 16A and 16B), it becomes possible to freely set the point at which I2 starts flowing. In FIGS. 16A and 16B, 48 is a level shift circuit formed by Qe12 and Qe13. In FIG. 16A, the level shift circuit 48 is capable of level shifting the gate input voltages of the third Qe8 and sixth Qe11 transistors. In FIG. 16B, the level shift circuit 48 is capable of level shifting the gate input voltages of the fourth Qe9 and fifth Qe10 transistors. As a result, the voltage at which the additional bias current I3 starts flowing can be set at a desired value. FIG. 17 shows an example of the waveforms of a current I3 to be added to the bias current of the differential input stage, in the case of the FIGS. 16A and 16B op amp.

EMBODIMENT 7

Figure 7:
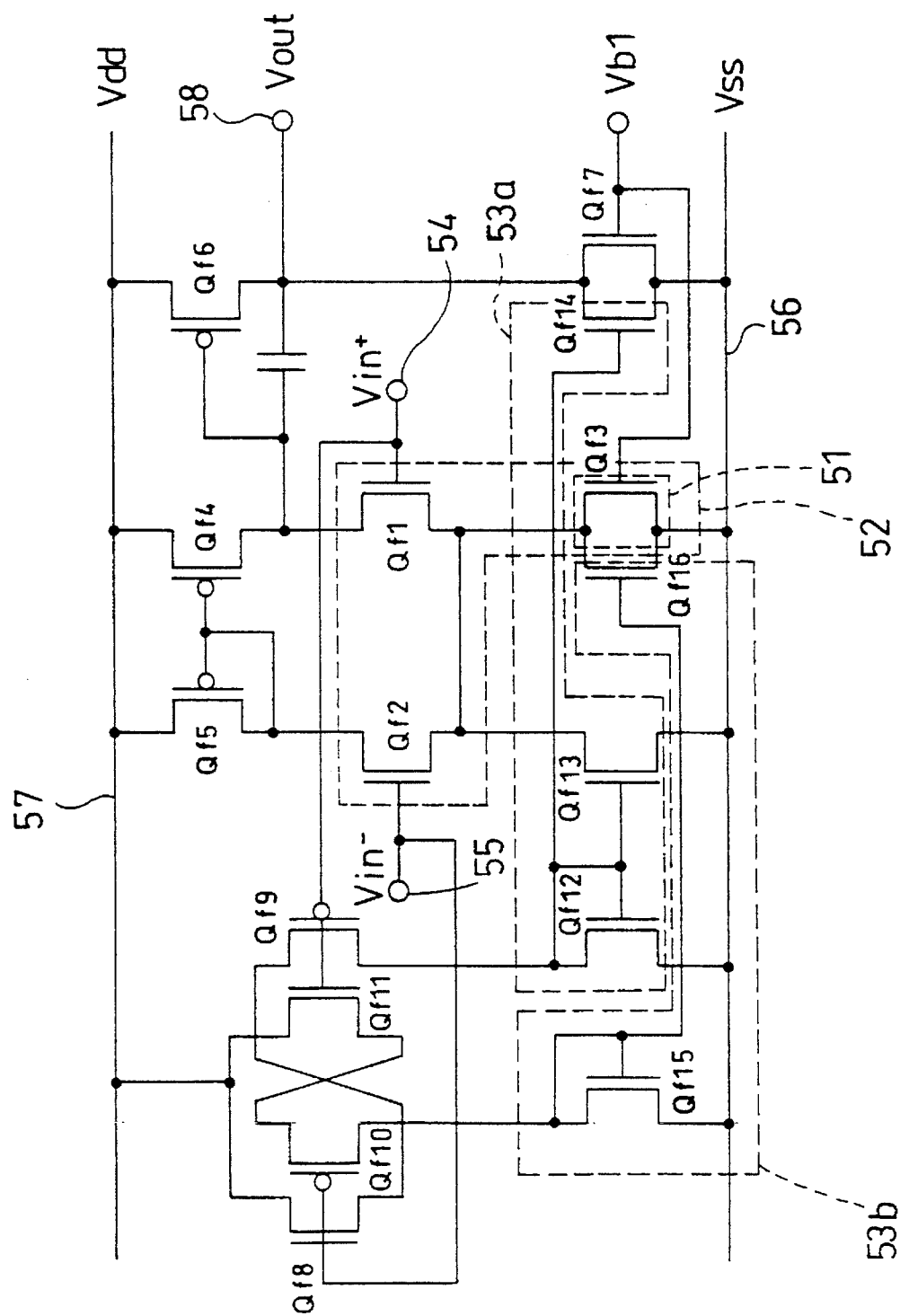
FIG. 7 is a wiring diagram showing a seventh op amp of the present invention.

Referring now to FIG. 7, a seventh embodiment of the present invention is described below. In this embodiment, a differential input stage 52 has a differential pair of NMOS transistors Qf1 and Qf2.

As shown in FIG. 7, the first and second transistors, i.e., Qf1 and Qf2, are connected together source-to-source. These transistors Qf1 and Qf2 are brought into connection with a constant-current source 51 formed by an NMOS transistor Qf3 with a gate at which the bias voltage $V_{b1}$ is applied. These three transistors Qf1, Qf2, and Qf3 make up the differential input stage 52 of the first stage. PMOS transistors Qf4 and Qf5 make up an active load for the differential input stage 52. A PMOS transistor Qf6 and an NMOS transistor Qf7 make up an inverter amplifier of the second stage. A first current mirror circuit 53a is made up of NMOS transistors Qf12, Qf13, and Qf14. A second current mirror circuit 53b is made up of NMOS transistors Qf15 and Qf16. Qf8 (i.e., the third transistor of the NMOS type) and Qf9 (i.e., the fourth transistor of the PMOS type) are connected together source-to-source. Qf10 (i.e., the fifth transistor of the PMOS type) and Qf11 (i.e., the sixth transistor of the NMOS type) are connected together source-to-source. The drain of Qf9 is connected with the drain of Qf12 that is a diode-connected transistor. The drain of Qf10 is connected with the drain of Qf15 that is a diode-connected transistor. The drains of Qf8 and Qf11 are connected with a high-level power supply source 57. The gates of Qf9 and Qf11 are connected with a noninverting input terminal 54. The gates of Qf8 and Qf10 are connected with an inverting input terminal 55. 56 is a low-level power supply source. 58 is an output terminal. $V_{in+}$ is the noninverting input voltage. $V_{in-}$ is the inverting input voltage. $V_{out}$ is the output voltage. $V_{dd}$ is the high-level supply voltage. $V_{ss}$ is the low-level supply voltage.

If $V_{in+} = V_{in-}$, the transistors Qf8 and Qf9, connected together source-to-source, and the transistors Qf10 and Qf11, connected together source-to-source, are cut off because the gate-to-source voltage is zero. No electric current flows. As a result, the differential input stage 52 is biased only by the current of the constant-current source 51 formed by Qf3.

If an electric potential is produced between $V_{in+}$ and $V_{in-}$, ($V_{in+} > V_{in-}$), and if such a potential exceeds a sum of $V_{tp} + V_{tn}$, this makes the transistors Qf10 and Qf11 turn on, whereupon a current proportional to the potential starts flowing. A current proportional to the current flowing in these transistors Qf10 and Qf11 is added by the second current mirror circuit 53b to the current of the constant-current source 51 in the differential input stage 52. As a result, the output rises at high speed.

If $V_{in-} > V_{in+}$, this makes the transistors Qf8 and Qf9 turn on and a current proportional to an electric potential between $V_{in+}$ and $V_{in-}$ starts flowing. A current proportional to the current flowing in these transistors Qf8 and Qf9 is added by the first current mirror circuit 53a to the current of the constant-current source 51 in the differential input stage 52 and the current of the constant-current source formed by NMOS transistor Qf7. As a result, the output falls at high speed.

In accordance with the present embodiment, the slew rate improves remarkably with no substantial increase in the power consumption.

In the present embodiment, Qf1 and Qf2, as the differential pair of the differential input stage 52, are NMOS transistors. However, this is not to be considered restrictive. PMOS transistors may be useful instead of NMOS transistors, with the same effects. In this case, every transistor of FIG. 7 should be reversed in polarity, and the low-level power supply source should be converted into a high-level one while the high-level power supply source into a low-level one. As in the case of FIG. 16A and 16B, if a source follower of transistors for level-shifting $V_{in+}$ and $V_{in-}$ is added, this makes it possible to freely set the voltage at which additional bias current starts flowing.

EMBODIMENT 8

Figure 8:
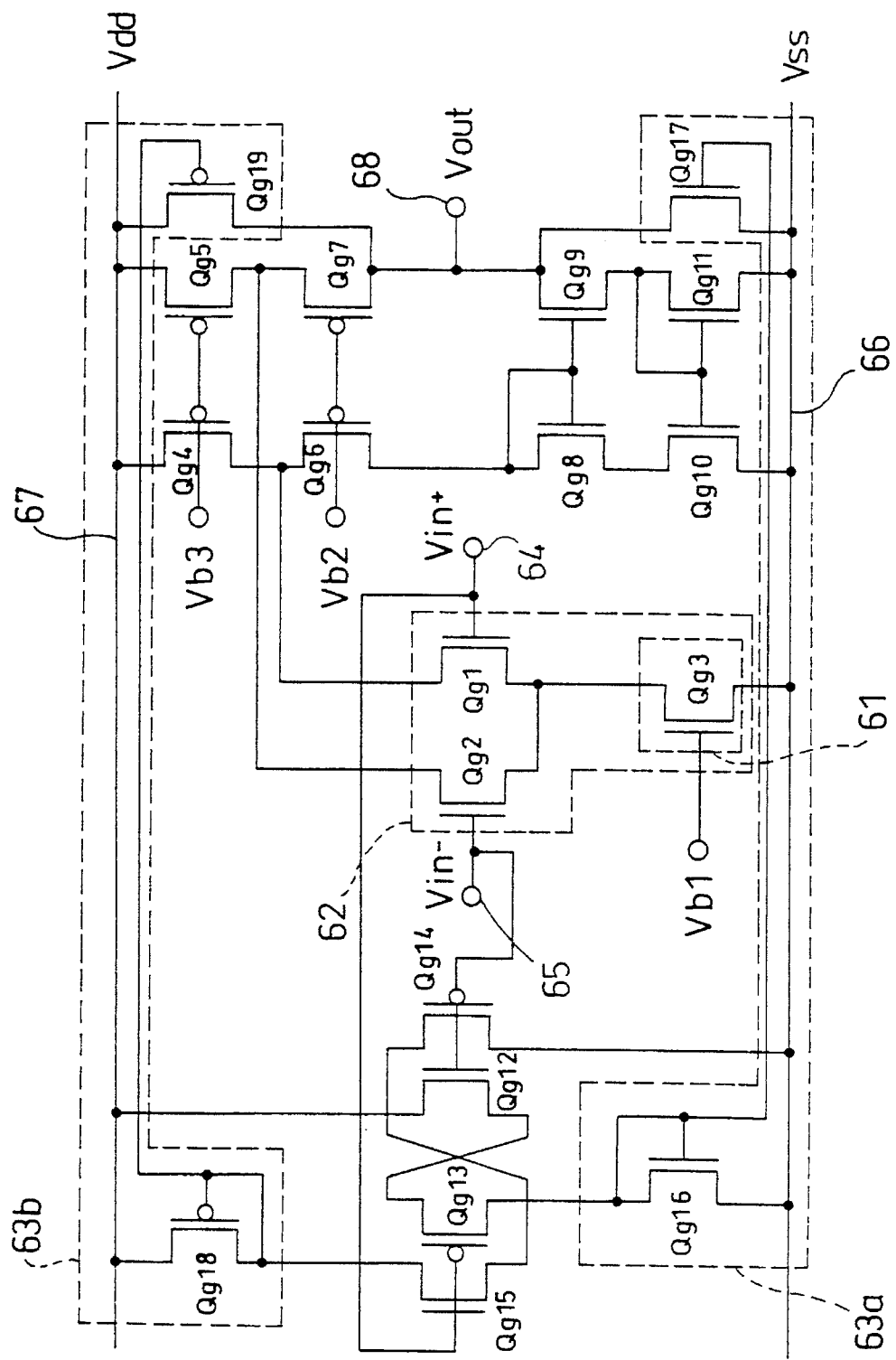
FIG. 8 is a wiring diagram showing an eighth op amp of the present invention.

An eighth embodiment of the present invention is described by making reference to FIG. 8. In this embodiment, a differential input stage 62 has a differential pair of NMOS transistors Qg1 and Qg2.

As shown in FIG. 8, the transistors Qg1 and Qg2 are connected together source-to-source. These transistors Qg1 and Qg2 are brought in connection with a constant-current source 61 formed by an NMOS transistor Qg3 with a gate at which $V_{b1}$ (i.e., the bias voltage) is applied. These three transistors Qg1, Qg2, and Qg3 make up the differential input stage 62. PMOS transistors Qg4 and Qg5 with gates at which a given bias voltage $V_{b3}$ is applied make up a constant-current source. This constant-current source performs biasing of a load formed by transistors Qg8-11, via a cascode stage formed by PMOS transistors Qg6 and Qg7 with gates at which a given bias voltage $V_{b2}$ is applied. In other words, a folded-cascode-type op amp is formed by the transistors Qg1-11. A first current mirror circuit 63a is formed by NMOS transistors Qg16 and Qg17. A second current mirror circuit 63b is formed by PMOS transistors Qg18 and Qg19. Qg12 (i.e., the first transistor of the NMOS type) and Qg13 (i.e., the second transistor of the PMOS type) are connected together source-to-source. Qg14 (i.e., the third transistor of the PMOS type) and Qg15 (i.e., the fourth transistor of the NMOS type) are connected together source-to-source. The drain of Qg12 is connected with a high-level power supply source 67. The drain of Qg13 is connected with the drain of Qg16 that is a diode-connected transistor. The drain of Qg14 is connected with a low-level power supply source 66. The drain of Qg15 is connected with the drain of Qg18 that is a diode-connected transistor. The gates of Qg13 and Qg15 are connected with a noninverting input terminal 64. The gates of Qg12 and Qg14 are connected with an inverting input terminal 65. 68 is an output terminal. $V_{in+}$ is the noninverting input voltage. $V_{in-}$ is the inverting input voltage. $V_{out}$ is the output voltage. $V_{dd}$ is the high-level supply voltage. $V_{ss}$ is the low-level supply voltage.

If an electric potential is produced between $V_{in+}$ and $V_{in-}$ (i.e., $V_+ > V_{in-}$), and if such a potential exceeds a sum of $V_{tp} + V_{tn}$, this makes the transistors Qg14 and Qg15 turn on, whereupon a current proportional to the potential starts flowing. The second current mirror circuit 63b injects a current proportional to the current flowing in these transistors Qg14 and Qg15 into the output terminal 68. As a result, the output voltage $V_{out}$ rises at high speed.

If $V_{in-} > V_{in+}$, this makes the transistors Qg12 and Qg13 turn on and a current proportional to such an electric potential starts flowing. The first current mirror circuit 63a injects a current proportional to the current flowing in these transistors Qg12 and Qg13 into the output terminal 68. As a result, the output voltage $V_{out}$ falls at high speed.

The present embodiment is able to provide a remarkably improved slew rate with no substantial increase in the power consumption.

In the present embodiment, the transistors Qg1 and Qg2 acting as the differential pair of the differential input stage 62 are NMOS transistors. However, this is not to be considered restrictive. PMOS transistors may be useful instead of NMOS transistors, with the same effects. In this case. Every transistor off FIG. 8 should be reversed in polarity, and the low-level power supply source should be converted into a high-level one while the high-level power supply source into a low-level one. As in the case of FIGS. 16A and 16B, if a source follower of transistors for level-shifting $V_{in+}$ and $V_{in-}$ is added, this makes it possible to freely set the voltage at which additional bias current starts flowing.

EMBODIMENT 9

Figure 9:
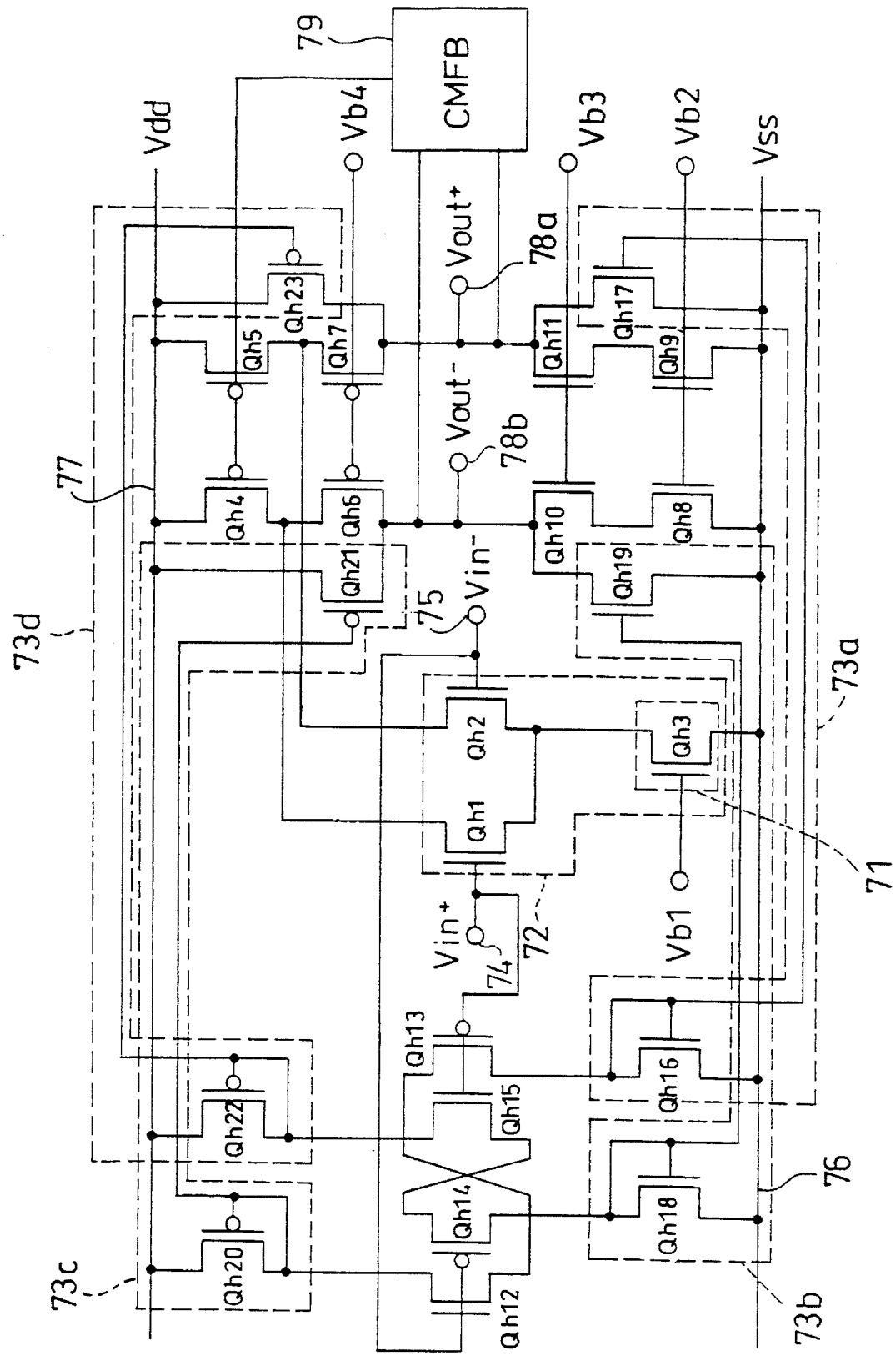
FIG. 9 is a wiring diagram showing a ninth op amp of the present invention.

A ninth embodiment of the present invention is described by making reference to FIG. 9. In this embodiment, a differential input stage 72 has a differential pair of NMOS transistors Qh1 and Qh2.

As shown in FIG. 9, the transistors Qh1 and Qh2 are connected together source-to-source. These transistors Qh1 and Qh2 are brought in connection with a constant-current source 71 Formed by an NMOS transistor Qh3 with a gate at which $V_{b1}$ (i.e., the bias voltage) is applied. These three transistors Qh1, Qh2, and Qh3 make up the differential input stage 72. PMOS transistors Qh4 and Qh5, which are biased by the output of a common mode feed back (CMFB) circuit 79 that inputs two differential output voltages, performs biasing of a load formed by a constant-current source of NMOS transistors Qh8 and Qh9 with gates at which $V_{b2}$ is applied and a cascode stage of NMOS transistors Qh10 and Qh11 with gates at which a given bias voltage $V_{b3}$ is applied, via a cascode stage formed by PMOS transistors Qh6 and Qh7 with gates at which a given bias voltage $V_{b4}$ is applied.

In other words, the transistors Qh1–Qh11 make up a fully differential folded cascode type op amp. A first current mirror circuit 73a is formed by NMOS transistors Qh16 and Qh17. A second current mirror circuit 73b is formed by NMOS transistors Qh18 and Qh19. A third current mirror circuit 73c is formed by PMOS transistors Qh20 and Qh21. A fourth current mirror circuit 73d is formed by PMOS transistors Qh22 and Qh23, Qh12 (i.e., the first transistor of the NMOS type) and Qh13 (i.e., the second transistor of the PMOS type) are connected together source-to-source. Qh14 (i.e., the third transistor of the PMOS type) and Qh15 (i.e., the fourth transistor of the NMOS type) are connected together source-to-source. Qh12 and Qh20 that is a diode-connected transistor are connected together drain-to-drain. Qh13 and Qh16 that is a diode-connected transistor are connected together drain-to-drain. Qh14 and Qh18 that is a diode-connected transistor are connected together drain-to-drain. Qh15 and Qh22 that is a diode-connected transistor are connected together drain-to-drain. The gates of Qh13 and Qh15 are connected with a noninverting input terminal 74, The gates of Qh12 and Qh14 are connected with an inverting input terminal 75, 76 is a low-level power supply source, 77 is a high-level power supply source, 78a is a noninverting output terminal, 78b is an inverting output terminal, $V_{in+}$ is the noninverting input voltage, $V_{in-}$ is the inverting input voltage, $V_{out+}$ is the noninverting output voltage. $V_{out}$ is the inverting output voltage. $V_{dd}$ is the high-level supply voltage. $V_{ss}$ is the low-level supply voltage.

If an electric potential is produced between $V_{in+}$ and $V_{in-}$ (i.e., $V_{in+}>V_{in-}$), and if such a potential exceeds a total of $V_{tp}+V_{tn}$, this makes the transistors Qh14 and Qh15 turn on so that a current proportional to the potential starts flowing. The second current mirror circuit 73b injects a current proportional to the current flowing in these transistors Qh14 and Qh15 into the inverting output terminal 78b, and the fourth current mirror circuit 73d injects same into the noninverting output terminal 78a. As a result, tile inverting output falls at high speed and the noninverting output rises at high speed.

If $V_{in-}>V_{in+}$, this makes the transistors Qh12 and Qh13 turn on and a current proportional to such an electric potential starts flowing. The first current mirror circuit 73a injects a current proportional to the current flowing in these transistors Qh12 and Qh13 into the noninverting output terminal 78a, and the third current mirror circuit 73c injects same into the inverting output terminal 78b. As a result, the inverting output rises at high speed and the noninverting output falls at high speed.

The present embodiment is able to provide a remarkably improved slew rate with no substantial increase in the power consumption.

In the present embodiment, the transistors Qh1 and Qh2 acting as the differential pair of the differential input stage 72 are NMOS transistors. However, this is not to be considered restrictive. PMOS transistors may be useful instead of NMOS transistors, with the same effects. In this case, every transistor of FIG. 9 should be reversed in polarity, and the low-level power supply source should be converted into a high-level one while the high-level power supply source into a low-level one. As in the case of FIGS. 16A and 16B, if a source follower of transistors for level-shifting $V_{in+}$ and $V_{in-}$ is added, this makes it possible to freely set the voltage at which additional bias current starts flowing.

The invention claimed is:

1. An operational amplifier comprising:

a differential input stage having first and second transistors of the first conductivity type that are connected together source-to-source and a constant-current source that is connected with sources of said first and second transistors;

third, fourth, and fifth transistors of the second conductivity type that are connected together source-to-source;

a bias feed means for feeding a bias current to sources of said third, fourth, and fifth transistors; and a current mirror circuit that has a plurality of transistors of the first conductivity type;

wherein:

a noninverting input voltage is applied to a gate of said third transistor, and an inverting input voltage is applied to a gate of said fourth transistor, and a source voltage of said first and second transistors is applied to a gate of said fifth transistor; and a current proportional to a current flowing in said third or fourth transistor is added by means of said current mirror circuit to a current of said constant-current source.

2. An operational amplifier according to claim 1 wherein said bias feed means is a constant-current source.

3. An operational amplifier according to claim 1 wherein said bias feed means is a resistor.

4. An operational amplifier comprising:

a differential input stage having first and second transistors of the first conductivity type that are connected together source-to-source and a constant-current source that is connected with sources of said first and second transistors;

third, fourth, and fifth transistors of the second conductivity type that are connected together source-to-source;

a bias feed means for feeding a bias current to sources of said third, fourth, and fifth transistors; and first and second current mirror circuits each having a plurality of transistors of the first conductivity type;

wherein:

a noninverting input voltage is applied to a gate of said third transistor, and an inverting input voltage is applied to a gate of said fourth transistor, and a source voltage of said first and second transistors is applied to a gate of said fifth transistor;

a current proportional to a current flowing in said third transistor is added to a current of said constant-current source and is injected into an output terminal, by means of said first current mirror circuit; and a current proportional to a current flowing in said fourth transistor is added to said current of said constant-current source by means of said second current mirror circuit.

5. An operational amplifier according to claim 4 wherein said bias feed means is a constant-current source.

6. An operational amplifier according to claim 4 wherein said bias feed means is a resistor.

7. An operational amplifier comprising:

a differential input stage having first and second transistors of the first conductivity type that are connected together source-to-source and a constant-current source that is connected with sources of said first and second transistors;

third, fourth, and fifth transistors of the second conductivity type that are connected together source-to-source;

a bias feed means for feeding a bias current to sources of said third, fourth, and fifth transistors; and first and second current mirror circuits each having a plurality of transistors of the first conductivity type; and a third current mirror circuit having a plurality of transistors of the second conductivity type;

wherein:

a noninverting input voltage is applied to a gate of said third transistor, and an inverting input voltage is applied to a gate of said fourth transistor, and a source voltage of said first and second transistors is applied to a gate of said fifth transistor:

a current proportional to a current flowing in said third transistor is injected into an output terminal by means of said first current mirror circuit;

a current proportional to a current flowing in said fourth transistor is fed by means of said second current mirror circuit to said third current mirror circuit; and a current proportional to said current from said second current mirror circuit is injected into said output terminal by means of said third current mirror circuit.

8. An operational amplifier according to claim 7 wherein said bias feed means is a constant-current source.

9. An operational amplifier according to claim 7 wherein said bias feed means is a resistor.

10. An operational amplifier comprising:

a differential input stage having first and second transistors of the first conductivity type that are connected together source-to-source and a constant-current source that is connected with sources of said first and second transistors;

third, fourth, and fifth transistors of the second conductivity type that are connected together source-to-source;

a bias feed means for feeding a bias current to sources of said third, fourth, and fifth transistors;

first and second current mirror circuits each having a plurality of transistors of the first conductivity type; and third and fourth current mirror circuits each having a plurality of transistors of the second conductivity type;

wherein:

a noninverting input voltage is applied to a gate of said third transistor, and an inverting input voltage is applied to a gate of said fourth transistor, and a source voltage of said first and second transistors is applied to a gate of said fifth transistor;

a current proportional to a current flowing in said third transistor is fed to said third current mirror circuit by means of said first current mirror circuit;

a current proportional to said current flowing in said in said third transistor is injected into a noninverting output terminal by means of said first current mirror circuit;

a current proportional to said current from said first current mirror circuit is injected into an inverting output terminal by means of said third current mirror circuit:

a current proportional to a current flowing in said fourth transistor is fed to said fourth current mirror circuit by means of said second mirror circuit;

a current proportional to said current flowing in said fourth transistor is injected into said inverting output terminal by means of said second current mirror circuit; and a current proportional to said current from said second current mirror circuit is injected into said noninverting output terminal by means of said fourth current mirror circuit.

11. An operational amplifier according to claim 10 wherein said bias feed means is a constant-current source.

12. An operational amplifier according to claim 10 wherein said bias feed means is a resistor.

13. An operational amplifier comprising:

a differential input stage having first and second transistors of the first conductivity type that are connected together source-to-source and a constant-current source that is connected with sources of said first and second transistors;

a third transistor of the first conductivity type and a fourth transistor of the second conductivity type, said third and fourth transistors being connected together source-to-source;

a fifth transistor of the second conductivity type and a sixth transistor of the first conductivity type, said fifth and sixth transistors being connected together source-to-source;

a current mirror circuit that has a plurality of transistors of the first conductivity type;

wherein:

an inverting input voltage is applied to gates of said third and fifth transistors, and a noninverting input voltage is applied to gates of said fourth and sixth transistors; and a current proportional to a current flowing in said third and fourth transistors or said fifth and sixth transistors is added by means of said current mirror circuit to a current of said constant-current source.

14. An operational amplifier according to claim 13 further including a level-shift circuit for level-shifting the gate input voltages of said third and sixth transistors.

15. An operational amplifier according to claim 13 further including a level-shift circuit for level-shifting the gate input voltages of said fourth and fifth transistors.

16. An operational amplifier comprising:

a differential input stage having first and second transistors of the first conductivity type that are connected together source-to-source and a constant-current source that is connected with sources of said first and second transistors;

a third transistor of the first conductivity type and a fourth transistor of the second conductivity type, said third and fourth transistors being connected together source-to-source;

a fifth transistor of the second conductivity type and a sixth transistor of the first conductivity type, said fifth and sixth transistors being connected together source-to-source;

first and second current mirror circuits each having a plurality of transistors of the first conductivity type;

wherein:

an inverting input voltage is applied to gates of said third and fifth transistors, and a noninverting input voltage is applied to gates of said fourth and sixth transistors;

a current proportional to a current flowing in said third and fourth transistors is added to a current of said constant-current source and is injected into an output terminal, by means of said first current mirror circuit; and a current proportional to a current flowing in said fifth and sixth transistors is added to said current of said constant-current source by means of said second current mirror circuit.

17. An operational amplifier according to claim 16 further including a level-shift circuit for level-shifting the gate input voltages of said third and sixth transistors.

18. An operational amplifier according to claim 16 further including a level-shift circuit for level-shifting the gate input voltages of said fourth and fifth transistors.

19. An operational amplifier comprising:

a first transistor of the first conductivity type and a second transistor of the second conductivity type, said first and second transistors being connected together source-to-source;

a third transistor of the second conductivity type and a fourth transistor of the first conductivity type, said third and fourth transistors being connected together source-to-source;

a first current mirror circuit having a plurality of transistors of the first conductivity type; and a second current mirror circuit having a plurality of transistors of the second conductivity type;

wherein:

an inverting input voltage is applied to gates of said first and third transistors, and a noninverting voltage is applied to gates of said second and fourth transistors;

a current proportional to a current flowing in said first and second transistors is injected by means of said first current mirror circuit into an output terminal; and a current proportional to a current flowing in said third and fourth transistors is injected by means of said second current mirror circuit into said output terminal.

20. An operational amplifier according to claim 19 further including a level-shift circuit for level-shifting the gate input voltages of said first and fourth transistors.

21. An operational amplifier according to claim 19 further including a level-shift circuit for level-shifting the gate input voltages of said second and third transistors.

22. An operational amplifier comprising:

a first transistor of the first conductivity type and a second transistor of the second conductivity type, said first and second transistors being connected together source-to-source;

a third transistor of the second conductivity type and a fourth transistor of the first conductivity type, said third and fourth transistors being connected together source-to-source;

first and second current mirror circuits each having a plurality of transistors of the first conductivity type; and third and fourth current mirror circuits each having a plurality of transistors of the second conductivity type;

wherein:

an inverting input voltage is applied to gates of said first and third transistors, and a noninverting input voltage is applied to gates of said second and fourth transistors;

a current proportional to a current flowing in said first and second transistors is injected by means of said first current mirror circuit into a noninverting output terminal and is injected by means of said third current mirror circuit into an inverting output terminal; and a current proportional to a current flowing in said third and fourth transistors is injected by means of said second current mirror circuit into said inverting output terminal and is injected by means of said fourth current mirror circuit into said noninverting output terminal.

23. An operational amplifier according to claim 22 further including a level-shift circuit for level-shifting the gate input voltages of said first and fourth transistors.

24. An operational amplifier according to claim 22 further including a level-shift circuit for level-shifting the gate input voltages of said second and third transistors.

* * * * *